(12) United States Patent
Becker et al.

(10) Patent No.: US 10,749,055 B2
(45) Date of Patent: Aug. 18, 2020

(54) PRODUCTION OF SENSORS

(71) Applicant: OSRAM OLED GmbH, Regensburg (DE)

(72) Inventors: Dirk Becker, Langquaid (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/339,582

(22) PCT Filed: Oct. 5, 2017

(86) PCT No.: PCT/EP2017/075386
§ 371 (c)(1),
(2) Date: Apr. 4, 2019

(87) PCT Pub. No.: WO2018/065534
PCT Pub. Date: Apr. 12, 2018

(65) Prior Publication Data
US 2019/0237593 A1     Aug. 1, 2019

(30) Foreign Application Priority Data
Oct. 6, 2016   (DE) .................. 10 2016 118 996

(51) Int. Cl.
*H01L 31/18* (2006.01)
*H01L 25/16* (2006.01)
(Continued)

(52) U.S. Cl.
CPC ...... *H01L 31/02327* (2013.01); *H01L 25/167* (2013.01); *H01L 31/0203* (2013.01);
(Continued)

(58) Field of Classification Search
CPC .............. H01L 25/167; H01L 25/0657; H01L 25/0652; H01L 25/50; H01L 31/02005;
(Continued)

(56) References Cited

U.S. PATENT DOCUMENTS 9,711,552 B2 * 7/2017 Rudmann ......... H01L 27/14625
2011/0215342 A1   9/2011 Oliver
(Continued)

FOREIGN PATENT DOCUMENTS

DE  10 2010 034 565 A1   2/2012
DE  10 2011 113 483 A1   3/2013
(Continued)

*Primary Examiner* — Nikolay K Yushin
(74) *Attorney, Agent, or Firm* — DLA Piper LLP (US)

(57) ABSTRACT

A method of producing sensors includes providing a carrier plate; arranging semiconductor chips on the carrier plate, wherein the semiconductor chips include at least radiation-detecting semiconductor chips; providing radiation-transmissive optical elements on the carrier plate provided with the semiconductor chips, wherein a plurality of radiation-transmissive optical elements are provided jointly on the carrier plate provided with the semiconductor chips; and singulating the carrier plate provided with the semiconductor chips and the radiation-transmissive optical elements, thereby forming separate sensors including a section of the carrier plate, at least one radiation-detecting semiconductor chip and at least one radiation-transmissive optical element.

20 Claims, 12 Drawing Sheets

(51) Int. Cl.
  *H01L 31/0232*  (2014.01)
  *H01L 31/0203*  (2014.01)
  *H01L 31/02*    (2006.01)
  *H01L 31/167*   (2006.01)
  *H01L 33/62*    (2010.01)

(52) U.S. Cl.
  CPC .... *H01L 31/02005* (2013.01); *H01L 31/0232* (2013.01); *H01L 31/1876* (2013.01); *H01L 31/167* (2013.01); *H01L 33/62* (2013.01); *Y02P 70/521* (2015.11)

(58) Field of Classification Search
  CPC ............. H01L 31/0203; H01L 31/0232; H01L 31/02327; H01L 31/1876; H01L 31/167; H01L 33/62; H01L 33/0083; H01L 33/0093; H01L 33/06; H01L 33/10; H01L 33/14; H01L 33/16; H01L 33/285; H01L 33/405; Y02P 70/521

See application file for complete search history.

(56) References Cited

U.S. PATENT DOCUMENTS

| | | |
|---|---|---|
| 2012/0106150 A1 | 5/2012 | Vaes et al. |
| 2012/0299191 A1 | 11/2012 | Camacho |
| 2013/0292553 A1 | 11/2013 | Chang et al. |
| 2016/0056194 A1 | 2/2016 | Rudmann et al. |

FOREIGN PATENT DOCUMENTS

| | | |
|---|---|---|
| DE | 10 2012 109 905 A1 | 4/2014 |
| WO | 2015/053706 A1 | 4/2015 |
| WO | 2015/076750 A1 | 5/2015 |

\* cited by examiner

PRODUCTION OF SENSORS

TECHNICAL FIELD

This disclosure relates to a method of producing sensors.

BACKGROUND

Optical sensors may comprise a carrier plate and at least one radiation-detecting semiconductor chip arranged on the carrier plate. In a further configuration, at least one radiation-emitting semiconductor chip may additionally be arranged on the carrier plate.

To produce such sensors, a carrier plate may be provided, and semiconductor chips may be arranged on the carrier plate and electrically connected to contact surfaces of the carrier plate. Afterward, further component parts may be applied on the carrier plate provided with the semiconductor chips, and the assemblage constituted in this way may be singulated into separate sensors.

The further component parts may include light-blocking barrier structures, for example. The barrier structures may be realized in the form of separate frame or cover parts. The frame parts may comprise integrated lenses. During production, the frame parts may be individually adhesively bonded one after another on the carrier plate provided with the semiconductor chips.

There is nonetheless a need to provide an improved method of producing sensors.

SUMMARY

We provide a method of producing sensors including providing a carrier plate; arranging semiconductor chips on the carrier plate, wherein the semiconductor chips include at least radiation-detecting semiconductor chips; providing radiation-transmissive optical elements on the carrier plate provided with the semiconductor chips, wherein a plurality of radiation-transmissive optical elements are provided jointly on the carrier plate provided with the semiconductor chips; and singulating the carrier plate provided with the semiconductor chips and the radiation-transmissive optical elements, thereby forming separate sensors including a section of the carrier plate, at least one radiation-detecting semiconductor chip and at least one radiation-transmissive optical element.

LIST OF REFERENCE SIGNS

Figure 1:
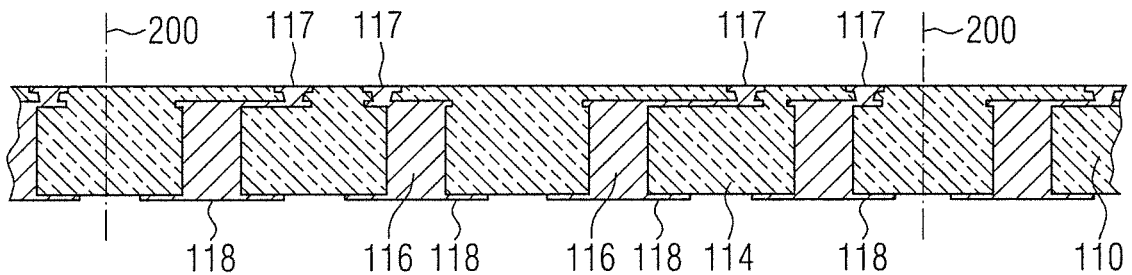
FIGS. 1 to 8 show one possible method of producing sensors on the basis of lateral illustrations, wherein the sensors comprise a printed circuit board, semiconductor chips, an embedding layer, contact layers for contacting front-side contacts of the semiconductor chips and optical elements, and wherein the optical elements are produced with the aid of a molding process.

100 Sensor
110 Printed circuit board/Carrier plate
114 Insulating material
116 Conductor structure
117 Contact surface
118 Contact surface
121 Semiconductor chip, emitter
122 Semiconductor chip, detector
124 Detection region
125 Front-side contact
130 Embedding layer
135 Cutout
140 Contact layer
150 Insulating layer
155 Electrical connection element
160 Optical element
165 Molding compound
170 Barrier structure
175 Adhesive
180 Optics assemblage
181 Optical element
182 Connection web
190 Bond wire
195 Radiation-transmissive element
200 Separating line
210 Tool part
215 Cavity
220 UV radiation
250 Leadframe
251 Leadframe section
252 Connection structure
254 Plastics material

DETAILED DESCRIPTION

Our method of producing sensors may comprise providing a carrier plate and arranging semiconductor chips on the carrier plate. The semiconductor chips arranged on the carrier plate comprise at least radiation-detecting semiconductor chips. Provision is furthermore made for providing radiation-transmissive optical elements on the carrier plate provided with the semiconductor chips. In this step, a plurality of radiation-transmissive optical elements are provided jointly on the carrier plate provided with the semiconductor chips. Furthermore, singulating the carrier plate provided with the semiconductor chips and the radiation-transmissive optical elements is carried out. In this way, separate sensors are formed, wherein each comprises a section of the carrier plate, at least one radiation-detecting semiconductor chip and at least one radiation-transmissive optical element.

The method involves producing a continuous assemblage comprising a plurality of sensors subsequently singulated into separate sensors. The sensors comprise at least one radiation-detecting semiconductor chip and at least one radiation-transmissive optical element for beam shaping. Such an optical element may be assigned to each radiation-detecting semiconductor chip of a sensor. The method involves providing a plurality of optical elements jointly on the carrier plate provided with the semiconductor chips, instead of placing and adhesively bonding the elements individually, for example. This enables largely parallel processing of the sensors fabricated in an assemblage. This leads to a time and cost advantage in production, which may be manifested to a significant extent in relatively large production volumes.

Further possible details and examples that may be considered for the method and the sensors produced in accordance with the method are described in greater detail below.

The method may be carried out such that all radiation-transmissive optical elements are provided jointly on the carrier plate provided with the semiconductor chips. In this configuration, the optical elements may also be referred to as wafer-level optical units. It is also possible for a plurality of subgroups (clusters) of radiation-transmissive optical elements to be provided. Here, a plurality of radiation-transmissive optical elements of individual subgroups may be provided jointly on the carrier plate provided with the semiconductor chips. As is described in even greater detail further below, providing optical elements may comprise producing optical elements on the carrier plate provided with the semiconductor chips or separately fabricating optical elements connected to one another and arranging them on the carrier plate provided with the semiconductor chips.

The carrier plate provided that is severed in the singulating step may comprise two opposite main sides. The semiconductor chips may be arranged on one of the main sides. At this main side, the carrier plate may comprise accessible metallic contact surfaces. The semiconductor chips arranged on this main side may electrically connect to the contact surfaces of the carrier plate that are present at the same main side.

The carrier plate may furthermore likewise comprise accessible metallic contact surfaces at the opposite main side. In this example, contact surfaces present at the opposite main sides may be electrically connect to one another.

The radiation-detecting semiconductor chips used in the method may comprise a photodiode structure. Configurations are also possible in which the radiation-detecting semiconductor chips comprise a plurality of detection regions, for example, in the form of a plurality of photodiode structures. In this example, the plurality of detection regions may be configured to enable a radiation detection in different wavelength ranges.

It is furthermore possible for the radiation-detecting semiconductor chips additionally to comprise circuit structures for evaluation. In such a configuration, the radiation-detecting semiconductor chips may be, for example, ASIC chips (Application Specific Integrated Circuit).

The sensors produced with the aid of the method may comprise only a single radiation-detecting semiconductor chip. Configurations in which the sensors comprise a plurality of semi-conductor chips are also possible. This may involve, for example, a plurality of radiation-detecting semiconductor chips configured, if appropriate, for radiation detection in different wavelength ranges. Furthermore, it is possible to realize sensors comprising at least one semiconductor chip of a different type besides at least one radiation-detecting semiconductor chip.

In this sense, in accordance with a further example, the semiconductor chips are arranged on the carrier plate additionally to comprise radiation-emitting semiconductor chips, and for the sensors formed by the singulating additionally to comprise at least one radiation-emitting semiconductor chip. In this configuration, an optical element for beam shaping may be assigned to each radiation-emitting semiconductor chip of a sensor.

The radiation-emitting semiconductor chips used in the method may be, for example, light-emitting diode chips or LED chips. Furthermore, the radiation-emitting semiconductor chips may be configured, for example, to emit infrared light radiation. It is also possible to use radiation-emitting semiconductor chips configured to emit visible light radiation.

The radiation-detecting semiconductor chips may be configured to detect the radiation emitted by the radiation-emitting semiconductor chips and reflected in a suitable manner. In this way, the sensors produced with the aid of the method may be, for example, proximity sensors or biomonitoring sensors.

In possible examples of the method, sensors may thus be fabricated that comprise one or a plurality of radiation-detecting semiconductor chips and, if appropriate, additionally one or a plurality of radiation-emitting semiconductor chips. Furthermore, it may be appropriate for the semiconductor chips arranged on the carrier plate to comprise not only optoelectronic semiconductor chips, but also semiconductor chips of a different type. This may involve driver chips, for example. Consequently, the sensors produced with the aid of the method may comprise at least one further semiconductor chip of a different type besides at least one optoelectronic semiconductor chip.

Before providing the radiation-transmissive optical elements, further component parts may be arranged or formed on the carrier plate. The following examples may be applied in this context.

In a further example, an embedding layer is formed on the carrier plate that laterally adjoins the semiconductor chips. The semiconductor chips may be circumferentially completely enclosed by the embedding layer. A front side of the semiconductor chips may be free of the embedding layer. The embedding layer may be formed from an insulating plastics material that may comprise a black or white color. The plastics material may be applied in liquid or viscous form on the carrier plate provided with the semiconductor chips and may subsequently be cured. In the singulating step carried out at the end of the method, the embedding layer may be severed together with the carrier plate.

If semiconductor chips are covered with the embedding layer on the front side in an undesired manner after the process of forming the embedding layer, a cleaning step of uncovering the front side may furthermore be carried out.

A molding process, also referred to as mold process, may, for example, be carried out to apply the plastics material to form the embedding layer. The molding process may be carried out with the aid of a molding or mold tool in which the carrier plate with the semiconductor chips located thereon may be received. The molding process may be a transfer molding process, for example, a film assisted transfer molding process (FAM). In this process, a film may be arranged on a tool part of a tool used for the transfer molding. In the transfer molding process, the tool part with the film may be pressed onto the front sides of the semiconductor chips arranged on the carrier plate. This is associated with sealing the front sides of the semiconductor chips, with the result that it is possible to apply the plastics material in a manner laterally adjoining the semiconductor chips and to suppress a front-side covering of the semiconductor chips with the plastics material.

It is also possible to carry out the process of applying the plastics material to form the embedding layer with the aid of a potting process. A circumferential wall, also referred to as a dam, may be formed or arranged on the carrier plate beforehand, this serving as delimitation to enclose a region provided for the potting.

The semiconductor chips used in the method may comprise a front-side contact and a rear-side contact. When arranging the semiconductor chips on the carrier plate, the semiconductor chips may electrically connect to contact surfaces of the carrier plate via the rear-side contacts of the semiconductor chips and an electrically conductive connection means.

Front-side contacts of semiconductor chips may electrically connect to contact surfaces of the carrier plate via contact layers and, if appropriate, further component parts. Such contact layers may be produced using a planar connection technology (PI, Planar Interconnect) and may therefore also be referred to as PI contacts or Picos contacts (Planar Interconnect Chip on Substrate). The following configurations may be applied in this context.

In a further example, cutouts are formed in the embedding layer, via which contact surfaces of the carrier plate are at least partly uncovered. Afterward, contact layers are formed, via which front-side contacts of semiconductor chips electrically connect to uncovered contact surfaces of the carrier plate. In this example, the relevant front-side contacts electrically connect to contact surfaces of the carrier plate in a direct manner via the contact layers. The contact layers may be arranged on semiconductor chips or on the front-side contacts thereof, the embedding layer and within the cutouts on the uncovered contact surfaces.

It is alternatively possible for electrical connections between front-side contacts of semiconductor chips and contact surfaces of the carrier plate not to be produced exclusively via contact layers. This holds true for the following example in which electrical connection elements are arranged on contact surfaces of the carrier plate before the process of forming the embedding layer. The embedding layer is formed in a manner laterally adjoining the electrical connection elements. If forming the embedding layer, as indicated above, is carried out with the aid of a film assisted transfer molding process, the film may also be pressed onto the electrical connection elements. Afterward, contact layers are formed, via which front-side contacts of semiconductor chips electrically connect to electrical connection elements. The electrical connection elements may be bodies formed from a metallic material, for example. In a further possible configuration, the electrical connection elements are metallized bodies comprising silicon, for example. The electrical connection elements may connect to the contact surfaces of the carrier plate via an electrically conductive connection means. In this example, the relevant front-side contacts of the semiconductor chips electrically connect to contact surfaces of the carrier plate via the contact layers and additionally via the electrical connection elements. The contact layers may be arranged on semiconductor chips or on the front-side contacts thereof, the embedding layer and the electrical connection elements.

Forming the contact layers may comprise carrying out an electrochemical or galvanic deposition. The following procedure may be adopted in this example First, a metallic initial layer may be deposited, for example, by carrying out a sputtering process. A photoresist layer may then be formed on the initial layer and subsequently be patterned by exposure and development. In this way, it is possible to predefine freed regions on the initial layer provided to produce the contact layers. The actual electrochemical deposition may subsequently be carried out. In this example, the initial layer serves as a deposition electrode, on which a metallic material is applied. The deposition takes place in the freed regions in which the initial layer is not covered with the patterned photoresist layer. Afterward, the photoresist layer may be removed, and an etching process may be carried out to remove the initial layer outside the contact layers. With the aid of this procedure, all the contact layers of the sensors fabricated in an assemblage may be produced in a parallel manner.

It may furthermore be appropriate, after forming the embedding layer and before forming the contact layers, to form insulating layers that cover the semiconductor chips on the front side at the edge and/or in the region of the front-side contacts and also the embedding layer in this region. The contact layers formed subsequently may in part also be arranged on the insulating layers. With the aid of the insulating layers, it is possible to prevent front-side contacts of semiconductor chips from being short-circuited with sidewalls of the semiconductor chips via the contact layers.

Forming the insulating layers may comprise, for example, applying a photoresist layer and patterning the same into the insulating layers by exposure and development. With the aid of this procedure, all the insulating layers of the sensors fabricated in an assemblage may be produced in a parallel manner.

With regard to the examples described above, providing the radiation-transmissive optical elements may be carried out after forming the contact layers. This procedure may be carried out on a surface constituted of the semiconductor chips, the embedding layer, the insulating layers (if provided) and the contact layers. On account of the contact layers, the surface may be planar or relatively planar and comprise a small topography. Providing the optical elements may be fostered in this way. Furthermore, the sensors may be produced with a small structural height. This proves to be expedient if only a limited structural space is available for the sensors. This holds true, for example, with regard to possible applications of the sensors in mobile devices.

Front-side contacts of semiconductor chips may also connect to contact surfaces of the carrier plate in a different way. This holds true for the following example, in which front-side contacts of semiconductor chips electrically connect to contact surfaces of the carrier plate via bond wires. After this, as described above, an embedding layer laterally adjoining the semiconductor chips or circumferentially enclosing the semiconductor chips may be formed on the carrier plate. In this configuration, the bond wires may be partly embedded in the embedding layer and partly project from the latter. Forming the embedding layer may be carried out with the aid of a potting process using a circumferential wall arranged on the carrier plate. For further possible details, for example, a black or white color of the embedding layer, reference is made to the description above. Providing the radiation-transmissive optical elements may be carried out after forming the embedding layer.

When bond wires are used, the following example may furthermore be considered to foster the subsequent process of providing the radiation-transmissive optical elements. In this example, radiation-transmissive elements are arranged on semiconductor chips, and front-side contacts of semiconductor chips electrically connect to contact surfaces of the carrier plate via bond wires. Furthermore, an embedding layer encapsulating the semiconductor chips and bond wires and laterally adjoining the radiation-transmissive elements is formed on the carrier plate.

In this configuration, the radiation-transmissive elements may be circumferentially completely enclosed by the embedding layer. Moreover, the radiation-transmissive elements may project beyond the bond wires. A front side of the radiation-transmissive elements may be free of the embedding layer. The radiation-transmissive elements may be formed from a glass material, for example, and comprise a laminar shape. In the sensors produced in this way, the radiation-transmissive elements make it possible that the semiconductor chips may still receive and, in emitters, emit a radiation or light radiation.

To form the embedding layer, features and details described above may be applied in a corresponding manner. The embedding layer may be formed, for example, from a plastics material comprising a black or white color, for example. The plastics material may be applied in liquid or viscous form on the carrier plate provided with the semiconductor chips and the radiation-transmissive elements and may be subsequently cured. A molding process, for example, a film assisted transfer molding process may be carried out for this purpose. In this example, the carrier plate provided with the semiconductor chips and the radiation-transmissive elements may be received in a tool comprising a tool part with a film arranged thereon. In the transfer molding process, this tool part with the film may be pressed onto the front sides of the radiation-transmissive elements. In this way, the plastics material may be applied such that the semiconductor chips and the bond wires are enclosed by the plastics material and the plastics material laterally adjoins the radiation-transmissive elements. On account of the film, a front-side covering of the radiation-transmissive elements with the plastics material may be suppressed. Alternatively, applying the plastics material may be carried out with the aid of a potting process using a circumferential wall arranged on the carrier plate. If radiation-transmissive elements are covered with the embedding layer on the front side in an undesired manner after the process of forming the embedding layer, a cleaning step of uncovering the front side may furthermore be carried out.

With regard to the procedure described above, providing the radiation-transmissive optical elements may be carried out after forming the embedding layer. This process may take place on a surface constituted of the radiation-transmissive elements and the embedding layer. In this configuration, the surface may be planar. Providing the optical elements may be fostered as a result.

The semiconductor chips used in the method may be arranged directly on the carrier plate. In this example, the semiconductor chips may be secured on the printed circuit board by way of a connection means, for example, an adhesive, a solder or a sintering paste. If an embedding layer is formed on the carrier plate, this may be carried out such that the embedding layer adjoins the carrier plate.

To provide the radiation-transmissive optical elements that may be carried out jointly for all optical elements or a plurality of optical elements of individual subgroups, examples described below may be applied. Insofar as processes carried out on the carrier plate provided with the semiconductor chips are described in this context, at least one further component part may also be present on the carrier plate, in accordance with the configurations mentioned above. This may involve the following: an embedding layer; contact layers; if appropriate insulating layers, if appropriate electrical connection elements; bond wires instead of the contact layers; if appropriate radiation-transmissive elements positioned on semiconductor chips. In this context, providing the optical elements, or else barrier structures described further below, may take place on a surface constituted as indicated above, for example, by the semiconductor chips, the embedding layer, the insulating layers (if provided) and the contact layers, or the radiation-transmissive elements and the embedding layer. Furthermore, a surface constituted of the semiconductor chips and the embedding layer may be present, wherein additionally projecting bond wires are present.

It is possible, for example, to carry out a molding or mold process. For this process, in accordance with a further example, provision is made to provide the radiation-transmissive optical elements to comprise molding and cure a radiation-transmissive molding compound on the carrier plate provided with the semiconductor chips. In this way, all optical elements of the sensors fabricated in an assemblage may be produced jointly. Furthermore, optical elements may be produced, for example, in the form of lenses comprising a curved surface.

The molding compound used may be a radiation-transmissive plastics material. To mold the molding compound, the carrier plate provided with the semiconductor chips may be received in a tool comprising a tool part comprising cavities coordinated with the optical elements to be produced. The molding compound may be applied on the carrier plate provided with the semiconductor chips and may subsequently be pressed to shape with the aid of the tool part such that the molding compound assumes the shape of the optical elements. Alternatively, the molding compound may be introduced into the cavities of the tool part and applied with the aid of the tool part in the form of the optical elements on the carrier plate provided with the semiconductor chips. These steps may be carried out in a liquid or viscous state of the molding compound. The shape of the optical elements realized with the aid of the cavities of the tool part may be fixed by the subsequent curing.

In this context, in accordance with a further example, provision is made for the molding compound to be a UV-curing molding compound, that is to say a molding compound that may be solidified under the influence of UV radiation (ultraviolet radiation). In this configuration, an irradiation with UV radiation is carried out to cure the molding compound. The molding process carried out using such a UV irradiation, which may also be referred to as a UV molding process or UV mold process, makes it possible to fabricate the optical elements in a simple and reliable manner. The UV-curing molding compound may be a UV-curing plastics material such as a hybrid polymer material, for example. With regard to the UV irradiation, the above-described tool part comprising the cavities may be transmissive to UV radiation. As a result, it is possible to irradiate the UV-curing molding compound with UV radiation through the tool part. If appropriate, consideration may be given to carrying out, after the UV curing, an additional post-curing of the molding compound by a thermal action to complete the solidification of the molding compound.

Carrying out a molding process to form optical elements may be appropriate if a planar or relatively planar surface is available which, as described above, is constituted, for example, by the semiconductor chips, the embedding layer, the insulating layers (if provided) and the contact layers or alternatively by the radiation-transmissive elements and the embedding layer.

Providing the radiation-transmissive optical elements may comprise separately producing an optics assemblage and arranging the optics assemblage on the carrier plate provided with the semiconductor chips. The optics assemblage comprises radiation-transmissive optical elements connected to one another. In this example, adjacent optical elements may connect to one another via connection webs. The optics assemblage may be produced from a radiation-transmissive plastics material. The optical elements of the optics assemblage may be, for example, lenses comprising a curved surface at two opposite sides. In the singulating step carried out at the end of the method, the optics assemblage may be severed and thus distributed among a plurality of sensors. The severing may be carried out at connection webs of the optics assemblage.

Besides an optics assemblage, at least one radiation-nontransmissive barrier structure comprising a black color, for example, may furthermore be provided on the carrier plate provided with the semiconductor chips. Such a configuration may be appropriate if sensors comprising at least one radiation-detecting semiconductor chip and at least one radiation-emitting semiconductor chip are produced with the aid of the method. Crosstalk between a radiation-emitting and a radiation-detecting semiconductor chip of the sensors may be suppressed in this way. This means that it is possible to at least partly prevent radiation emitted by the radiation-emitting semiconductor chip from passing to the radiation-detecting semiconductor chip without an interaction or radiation reflection provided for sensor operation occurring beforehand.

For such a functioning, the sensors may be produced with a barrier structure, wherein the barrier structure, relative to a plan view consideration, is present at least partly in a region located between a radiation-detecting semiconductor chip and a radiation-emitting semiconductor chip. In this example, the optically blocking barrier structure may be realized in the form of an elongate or linear section. The sensors may also be produced with a plurality of elongate barrier structures. Furthermore, configurations of sensors comprising a barrier structure comprising a plurality of continuous elongate sections and, if appropriate, a frame-type shape are possible.

To realize the configurations mentioned above, a continuous, for example, lattice-shaped barrier structure may be formed on the carrier plate provided with the semiconductor chips. In the singulating step, this lattice structure may be severed and thus distributed among a plurality of sensors. It is furthermore possible to form a plurality of, for example, linear barrier structures extending parallel to one another that may likewise be severed and distributed among a plurality of sensors during the singulating process.

Furthermore, the following examples may be applied to form one or a plurality of light-blocking barrier structures.

The optics assemblage may be arranged on the carrier plate provided with the semiconductor chips using a radiation-nontransmissive, for example, black adhesive. The adhesive may be applied beforehand on the carrier plate provided with the semiconductor chips. One or a plurality of barrier structures may be formed from the adhesive by curing. For this purpose, the adhesive, in accordance with the above-described possible configurations for barrier structures, may be applied, for example, in the form of a plurality of parallel lines or in the form of a lattice on the carrier plate provided with the semiconductor chips.

A radiation-nontransmissive barrier structure may be provided on the carrier plate provided with the semiconductor chips. Furthermore, the optics assemblage is arranged on the barrier structure. In this example, the optics assemblage may be adhesively bonded onto the barrier structure, for example. In accordance with the configurations described above, it is possible to provide a continuous, for example, lattice-shaped barrier structure on the carrier plate provided with the semiconductor chips. It is further possible to provide a plurality of, for example, linear barrier structures extending parallel to one another on which the optics assemblage may be arranged.

Providing the barrier structure may be carried out, for example, with the aid of a molding or mold process. For this purpose, in accordance with a further example, provision is made to provide the barrier structure to comprise molding and cure a molding compound on the carrier plate provided with the semiconductor chips. In a corresponding manner, a plurality of barrier structures may also be provided in this way.

The molding compound used in the molding process may be a black plastics material. To mold the molding compound, the carrier plate provided with the semiconductor chips may be received in a tool comprising a tool part comprising cavities coordinated with the barrier structure to be produced or the plurality of barrier structures to be produced. The molding compound may be introduced into the cavities of the tool part and applied with the aid of the tool part in the form of the barrier structure(s) on the carrier plate provided with the semiconductor chips. These steps may be carried out in a liquid or viscous state of the molding compound. The shape of the barrier structure(s) that is realized with the aid of the cavities of the tool part may be fixed by the subsequent curing.

It is furthermore possible to use a UV-curing molding compound, and in this respect carry out a UV irradiation for curing the molding compound. For this purpose, the tool part used comprising the cavities may be transmissive to UV radiation such that the molding compound may be irradiated with UV radiation through the tool part. In this context, too, it is possible, if appropriate, to carry out, after the UV curing, an additional post-curing of the molding compound by a thermal action to complete the solidification of the molding compound.

Carrying out a molding process to form one or a plurality of barrier structures may be appropriate if a planar or relatively planar surface is available which, as described above, is constituted of, for example, the semiconductor chips, the embedding layer, the insulating layers (if provided) and the contact layers or alternatively by the radiation-transmissive elements and the embedding layer.

Providing the barrier structure may comprise separately producing the barrier structure and arranging the barrier structure on the carrier plate provided with the semiconductor chips, for example, by adhesive bonding. In accordance with the configurations described above, the barrier structure produced may comprise a continuous lattice shape, for example. It is also possible for a plurality of, for example, linear barrier structures to be produced and arranged on the carrier plate provided with the semiconductor chips.

The optics assemblage provided itself may comprise a radiation-nontransmissive barrier structure. The latter may comprise a continuous lattice shape, for example. It is also possible for the optics assemblage to comprise a plurality of, for example, linear barrier structures extending parallel to one another. In this configuration, the optics assemblage comprising the barrier structure or comprising the plurality of barrier structures may be arranged on the carrier plate provided with the semiconductor chips, for example, by adhesive bonding.

Regarding the examples described above with regard to the use of an optics assemblage, it is possible for the optics assemblage used to comprise all optical elements of the sensors fabricated in an assemblage. It is also possible to use a plurality of separate optics assemblages each comprising a subgroup comprising a plurality of radiation-transmissive optical elements connected to one another. In this context, the configurations described above may be applied in a corresponding manner.

The carrier plate provided may be a printed circuit board. The printed circuit board that may comprise two opposite main sides, may also be referred to as a PCB or PCB substrate. The printed circuit board may comprise an insulating material and electrical conductor structures. The insulating material may be a prepreg material such as, for example, an FR4 or BT material (bismaleimide triazine). The conductor structures may be formed from a metallic material and comprise contact surfaces arranged at the two main sides of the printed circuit board and are accessible here. Furthermore, the conductor structures may comprise further constituents extending through the printed circuit board and/or located within the printed circuit board such as, for example, plated-through holes, conductive layers and the like, via which contact surfaces arranged at the different main sides may electrically connect to one another.

The carrier plate provided may comprise a metallic leadframe. The leadframe may comprise leadframe sections and connection structures that connect leadframe sections. The carrier plate may furthermore comprise an insulating plastics material. In this example, the plastics material may be molded around the leadframe such that the carrier plate comprises two planar opposite main sides constituted of the leadframe and the plastics material.

In the configuration mentioned above, the plastics material may close off interspaces of the leadframe, that is to say between the leadframe sections and the connection structures. The leadframe sections may constitute contact surfaces at the two main sides of the carrier plate. In the singulating step carried out at the end of the method, the leadframe-based carrier plate may be severed in the region of the connection structures. What may be achieved in this way is that the leadframe sections for each of the singulated sensors are electrically isolated from one another or no longer connected to one another via material of the leadframe.

It is furthermore pointed out that semiconductor chips used in the method may comprise one or else a plurality of front-side contacts. The latter example may be appropriate, for example, with regard to radiation-detecting semiconductor chips comprising a plurality of detection regions as a result of which the latter may be operated separately. By way of example, configurations in which semiconductor chips comprise only front-side contacts are also possible. Semiconductor chips comprising a plurality of rear-side contacts may be used in a corresponding manner. Features and details described above may be applied in a corresponding manner for the plurality of contacts of semiconductor chips. In semiconductor chips comprising a plurality of front-side contacts, by way of example, each front-side contact may electrically connect to a contact surface of the carrier plate via a contact layer and, if appropriate, additionally via an electrical connection element or alternatively via a bond wire.

Furthermore, attention is drawn to the possibility of providing radiation-transmissive optical elements not realized in the form of lenses comprising one or two curved surfaces. Optical elements comprising differently shaped optically effective surfaces are also possible. Surfaces of this type may comprise, for example, conical or pyramidal structure elements. It is also possible to provide optical elements in the form of Fresnel lenses, for example. Optical elements of this type may be produced in a corresponding manner in a molding process or be constituents of an optics assemblage used in the method.

The advantageous configurations and developments explained above may be applied individually or else in arbitrary combination with one another—apart, for example, in clear dependencies or incompatible alternatives.

The above-described properties, features and advantages and the way in which they are achieved will become clearer and more clearly understood in association with the following description of examples that are explained in greater detail in association with the schematic drawings.

Possible configurations of optical sensors 100 and associated production methods are described with reference to the following schematic figures. The sensors 100 comprise at least one radiation-detecting semiconductor chip 122. In the context of production, processes known from semiconductor technology and the fabrication of sensors and optoelectronic components may be carried out and routine materials in these fields may be used, and so they will be discussed only in part. In the same way, in addition to processes shown and described, further processes may be carried out and the sensors 100 may be fabricated with further component parts and structures in addition to component parts shown and described. The figures are merely of schematic nature and are not true to scale. In this sense, component parts and structures shown in the figures may be illustrated with exaggerated size or size reduction to afford a better understanding.

FIGS. 1 to 8 show one possible method of producing sensors 100 on the basis of lateral sectional illustrations. In this example, each sensor 100 comprises a radiation-emitting semiconductor chip 121 and a radiation-detecting semiconductor chip 122. The sensors 100 may be combined proximity and ambient light sensors that may be used both to detect objects and measure a brightness of the ambient light. FIG. 9 supplementarily shows a plan view illustration of a sensor 100 fabricated in accordance with the method in FIGS. 1 to 8.

The method involves fabricating a continuous assemblage comprising a plurality of sensors that is subsequently singulated into the separate sensors 100. FIGS. 1 to 4 and FIGS. 7 and 8 each show an excerpt substantially in the region of one of the sensors 100 to be produced. The conditions illustrated here may be present in a manner repeating multiply next to one another in a plane. For better elucidation, a repetition grid is indicated on the basis of dashed lines 200 in the relevant figures. Severing to singulate the sensor assemblage is also carried out at the lines 200 (cf. FIG. 8). The lines 200 are therefore referred to hereinafter as separating lines 200.

The method involves providing a carrier plate 110, as shown as an excerpt in FIG. 1. The carrier plate 110 is realized in the form of a printed circuit board (PCB, Printed Circuit Board), and therefore referred to hereinafter as printed circuit board 110. The printed circuit board 110 comprises an electrically insulating material 114 and electrical conductor structures 116. The insulating material 114 may be an FR4 material or a BT material, for example. The conductor structures 116 may be formed from a metallic material such as copper, for example. The conductor structures 116 comprise contact surfaces 117, 118 arranged at two opposite main sides of the printed circuit board 110 and are freely accessible and thereby contactable at the main sides. The side directed toward the top in the figures is a front side, and the side directed toward the bottom is a rear side of the printed circuit board 110. Accordingly, hereinafter the contact surfaces 117 are also referred to as front-side contact surfaces 117 and the other contact surfaces 118 are also referred to as rear-side contact surfaces 118.

As illustrated in FIG. 1, each conductor structure 116 may comprise a front-side contact surface 117 and a rear-side contact surface 118. Furthermore, the conductor structures 116 comprise constituents extending through the printed circuit board 110 and arranged within the printed circuit board 110. These are vertical plated-through holes and conductive layers. In this way, the front- and rear-side contact surfaces 117, 118 of the conductor structures 116 electrically connect to one another.

For reasons of clarity, FIG. 1 illustrates a construction for the printed circuit board 110 in which all constituents of the conductor structures 116 shown are present in the same sectional plane. However, the printed circuit board 110 may also be formed such that individual conductor structures 116 and/or constituents of conductor structures 116 are located in sectional planes offset with respect to one another.

Figure 2:
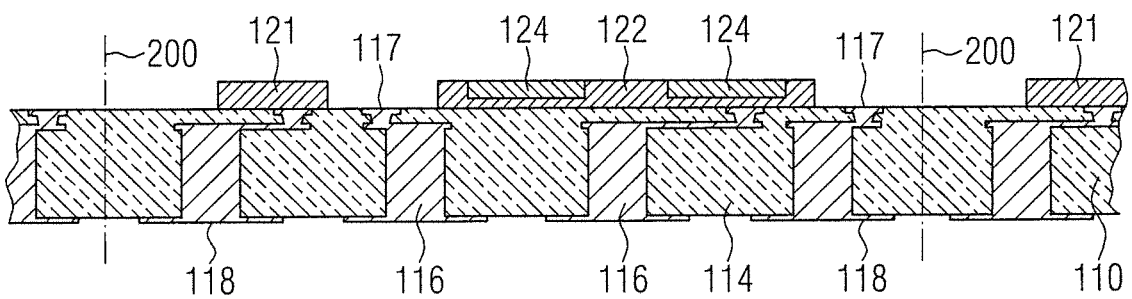

In a further step of the method as shown in FIG. 2, semiconductor chips 121, 122 are mounted on the front side of the printed circuit board 110. The semiconductor chips 121, 122 comprise a rear-side contact, not illustrated, and a front-side contact 125, shown only in FIGS. 5 and 6. The semiconductor chips 121, 122 may be electrically contacted via the contacts. In the context of chip mounting, the semiconductor chips 121, 122 may electrically connect to front-side contact surfaces 117 of the printed circuit board 110 via the rear-side contacts of the semiconductor chips and an electrically conductive connection means, not illustrated. The connection means may be, for example, an electrically conductive adhesive (for example, a silver conductive adhesive), a solder or a sintering paste (for example, a silver sintering paste).

For each sensor 100 to be produced, a radiation-emitting semiconductor chip 121 and a radiation-detecting semiconductor chip 122 are arranged on the printed circuit board 110 (cf. FIGS. 2 and 9). The radiation-emitting semiconductor chips 121, also called emitters 121 hereinafter, may be configured to emit infrared light radiation. The radiation-detecting semiconductor chips 122, also called detectors 122 hereinafter, may comprise a plurality of or two detection regions 124. The detection regions 124 of the detectors 122 may be configured to detect radiation in different wavelength ranges. In this example, one detection region 124 may be configured to detect visible light radiation, and the other detection region 124 may be configured to detect infrared light radiation emitted by an emitter 121 and reflected at an object. In this way, sensors 100 produced with the aid of the method are suitable for detecting objects and measuring the brightness of the ambient light.

The emitters 121 may be LED chips (Light Emitting Diode), for example. The detectors 122 may be photodiode chips, for example. In this example, the detection regions 124 of the detectors 122 may be realized in the form of photodiode structures.

Figure 3:
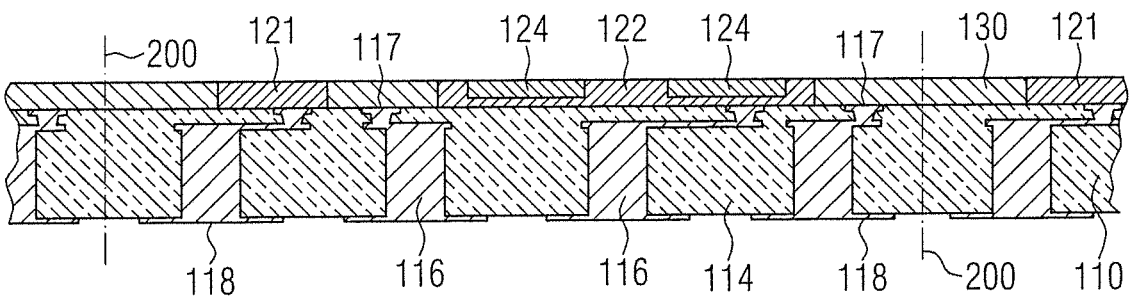

After chip mounting, as shown in FIG. 3, an insulating plastics material is applied on the front side of the printed circuit board 110 to form an embedding layer 130 laterally adjoining the semiconductor chips 121, 122 and circumferentially enclosing the semiconductor chips 121, 122. The plastics material may be applied in liquid or viscous form and then cured. The plastics material may be an epoxy material, for example. A further example is a hybrid material comprising a mixture of an epoxy material and a silicone material. The plastics material may furthermore contain a particulate filler. Furthermore, the plastics material may comprise a black or white color, for example.

As illustrated in FIG. 3, the embedding layer 130 may be formed such that the embedding layer 130 extends as far as front sides of the semiconductor chips 121, 122 and the front sides of the semiconductor chips 121, 122 are free of the embedding layer 130. For this purpose, by way of example, a film assisted transfer molding process may be carried out. In this example, on a tool part of a tool used for the transfer molding and in which the printed circuit board 110 provided with the semiconductor chips 121, 122 is received, a film is arranged (not illustrated). In the transfer molding process, this tool part with the film is pressed onto the front sides of the semiconductor chips 121, 122. This leads to a sealing of the front sides of the semiconductor chips 121, 122, as a result of which it is possible to apply the plastics material of the embedding layer 130 on the printed circuit board 110 in a manner laterally adjoining the semiconductor chips 121, 122 and avoid a front-side covering of the semiconductor chips 121, 122 with the plastics material.

A prerequisite for the procedure described above is that the semiconductor chips 121, 122 arranged on the printed circuit board 110 comprises the same or substantially the same thickness, for example, with a tolerance in the region of 5 µm. Such thickness fluctuations may be compensated for with the aid of the film.

In larger differences in thickness of, for example, 10 µm to 25 µm, the following procedure may be adopted. In this example, a photoresist material may be applied on lower semiconductor chips before the transfer molding process and may be removed again from the relevant semiconductor chips after the transfer molding process, for example, by wet-chemical stripping. In this way, the embedding layer 130 arranged on the printed circuit board 110 may comprise a larger thickness than the lower semiconductor chips and thus project beyond the lower semiconductor chips (not each illustrated).

Applying the plastics material to form the embedding layer 130 circumferentially enclosing the semiconductor chips 121, 122 may also be carried out in some other way. By way of example, it is possible to carry out a potting process. Before the process of potting the plastics material, a circumferential wall, also referred to as a dam, may be formed or arranged on the printed circuit board 110. The wall may serve as delimitation that encloses a region provided for the potting on the printed circuit board 110 (not each illustrated).

If semiconductor chips 121, 122 are covered with the plastics material on the front side in an undesired manner after the process of forming the embedding layer 130, it is furthermore possible to carry out a cleaning step (deflashing) to uncover covered semiconductor chips 121, 122 (not illustrated).

Figure 4:
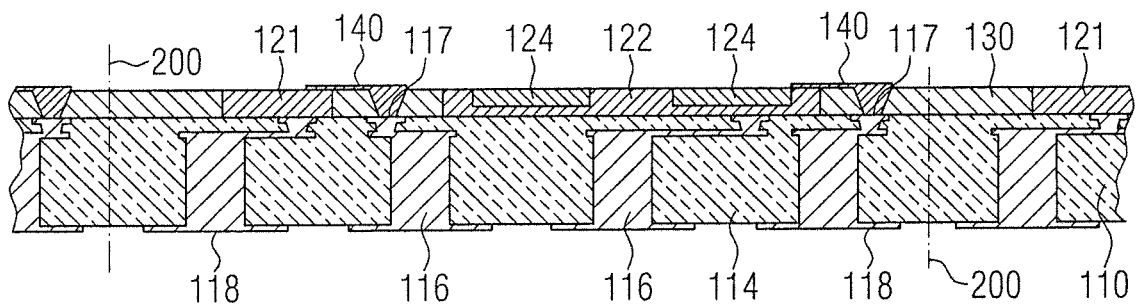

After forming the embedding layer 130, the front-side contacts 125 of the semiconductor chips 121, 122 electrically connect to further front-side contact surfaces 117 of the printed circuit board 110. This step comprises, inter alia, as shown in FIG. 4, forming contact layers 140 serving as conductor tracks.

Figure 5:
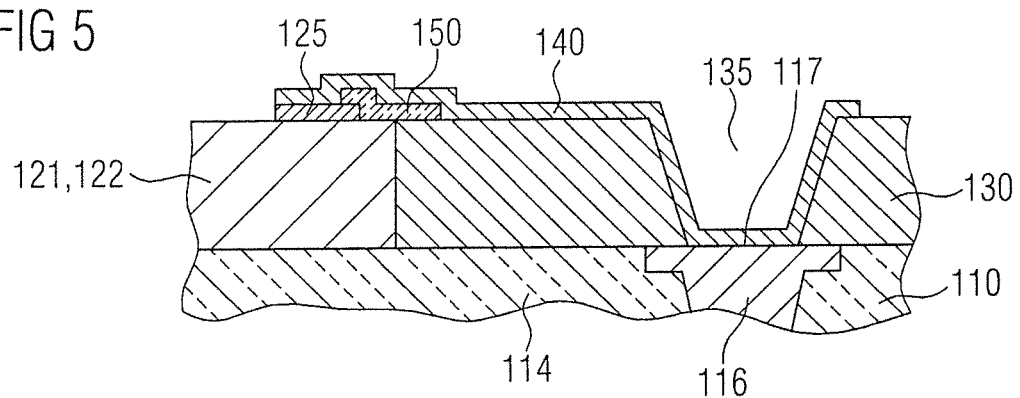

For better elucidation of a possible procedure explained below, FIG. 5 shows an enlarged lateral illustration of the printed circuit board 110 in the region of a semiconductor chip 121 or 122, respectively. This illustration may be applied with regard to all semiconductor chips 121, 122 arranged on the printed circuit board 110.

To produce electrical connections between the front-side contacts 125 of the semiconductor chips 121, 122 and front-side contact surfaces 117 of the printed circuit board 110, first, it is possible to form cutouts 135 in the embedding layer 130 via which the relevant contact surfaces 117 are at least partly freed (cf. FIG. 5). For this purpose, by way of example, a laser may be used (not illustrated).

Afterward, insulating layers 150 may be formed that cover the semiconductor chips 121, 122 at the edge in the region of the front-side contact 125 and also the embedding layer 130 in this region (cf. FIG. 5). For this purpose, by way of example, a photoresist layer may be applied and patterned into the insulating layers 150 by exposure and development (not illustrated). With the aid of the insulating layers 150, it is possible to prevent the front-side contacts 125 of the semiconductor chips 121, 122 from being short-circuited with sidewalls of the semiconductor chips 121, 122 via the contact layers 140 subsequently formed.

The contact layers 140 may subsequently be formed such that the front-side contacts 125 of the semiconductor chips 121, 122 electrically connect via the contact layers 140 to the contact surfaces 117 freed via the cutouts 135 of the embedding layer 130 (cf. FIG. 5). This may be carried out as follows.

At the beginning, a metallic initial layer may be deposited by sputtering, for example. Afterward, a photoresist layer may be formed on the initial layer and patterned by exposure and development. In this way, it is possible to predefine freed regions on the initial layer provided to produce the contact layers 140. An electrochemical or galvanic deposition may subsequently be carried out. In this example, the initial layer may serve as a deposition electrode on which metallic material is deposited in the freed regions not covered with the photoresist layer to form the contact layers 140. Afterward, the photoresist layer may be removed and an etching process may be carried out to remove the initial layer outside the contact layers 140 (not illustrated in each case).

As illustrated in FIG. 5 on the basis of a semiconductor chip 121, 122, the contact layers 140 may be arranged on the semiconductor chips 121, 122 or on the front-side contacts 125 thereof, the insulating layers 150, the embedding layer 130 and the freed contact surfaces 117. The contact layers 140 may furthermore be formed such that the contact layers 140 cover the embedding layer 130 completely within the cutouts 135, and outside the cutouts 135 in an edge region extending around the cutouts 135.

Figure 6:
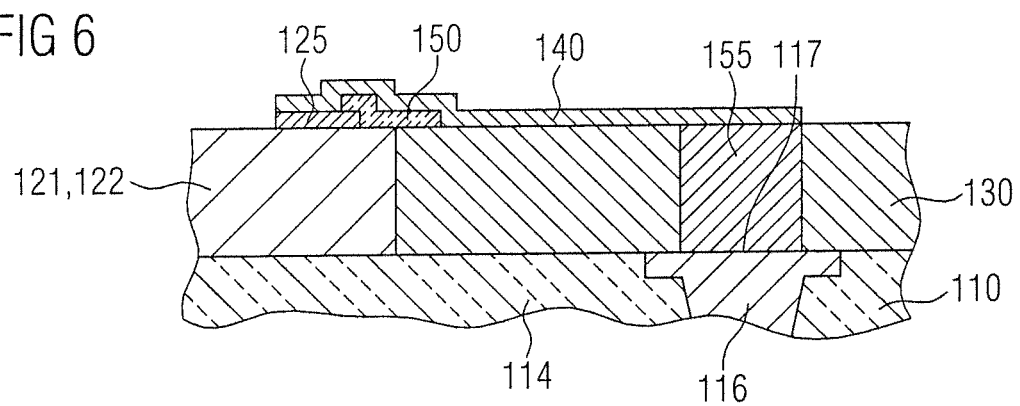

It is possible for the front-side contacts 125 of the semiconductor chips 121, 122 not to electrically connect to front-side contact surfaces 117 of the printed circuit board 110 exclusively via contact layers 140 deposited electrochemically. For better elucidation of a further procedure explained below, FIG. 6 shows a further enlarged lateral illustration of the printed circuit board 110 in the region of a semiconductor chip 121 or 122, respectively. This illustration, too, may be applied with regard to all semiconductor chips 121, 122 arranged on the printed circuit board 110.

To produce electrical connections between the front-side contacts 125 of the semiconductor chips 121, 122 and front-side contact surfaces 117 of the printed circuit board 110, it is possible, alternatively, before forming the embedding layer 130, to arrange electrical connection elements 155 on contact surfaces 117 of the printed circuit board 110 (cf. FIG. 6). The electrical connection elements 155 may comprise a thickness corresponding or substantially corresponding to the semiconductor chips 121, 122. The electrical connection elements 155 may be configured, for example, in the form of bodies comprising a metallic material. In a further possible configuration, the electrical connection elements 155 are in the form of bodies comprising silicon with a metallization, for example. Moreover, the electrical connection elements 155 may be in a parallelepipedal form, for example. Furthermore, the electrical connection elements 155 may be mounted together with the semiconductor chips 121, 122 on the printed circuit board 110. In the course of mounting, the electrical connection elements 155 may connect to the corresponding contact surfaces 117 via an electrically conductive connection means, not illustrated, for example, an electrically conductive adhesive, a solder or a sintering paste.

The embedding layer 130 subsequently formed may laterally adjoin the electrical connection elements 155 and circumferentially enclose the electrical connection elements 155, like the semiconductor chips 121, 122. If forming the embedding layer 130, as indicated above, is carried out with the aid of a film assisted transfer molding process, the tool part provided with the film may be pressed onto the electrical connection elements 155 for front-side sealing. When electrical connection elements 155 are covered with the plastics material on the front side in an undesired manner after the process of forming the embedding layer 130, the electrical connection elements may likewise be uncovered in the context of the cleaning step mentioned above (not illustrated in each case).

Afterward, it is possible to form the insulating layers 150 in the region of the semiconductor chips 121, 122, and subsequently the contact layers 140. Forming the contact layers 140 may be carried out such that the contact layers 140 are arranged on the semiconductor chips 121, 122 or on the front-side contacts 125 thereof, the insulating layers 150, the embedding layer 130 and the electrical connection elements 155 (cf. FIG. 6). As a result, the front-side contacts 125 of the semiconductor chips 121, 122 electrically connect to corresponding front-side contact surfaces 117 of the printed circuit board 110 not just via the contact layers 140, but additionally via the electrical connection elements 155. Forming the insulating layers 150 and the contact layers 140 may be carried out as described above.

The process sequences described above afford the possibility of forming all insulating layers 150 and all contact layers 140 in a parallel manner. In this way, these processes may be carried out rapidly and cost-effectively.

On account of the contact layers 140, the sensors 100 may furthermore be produced with a small structural height. This proves to be expedient with regard to possible applications, not shown, of the sensors 100 in mobile devices, for example. A high durability of the contact layers 140 is furthermore advantageous, with the result that the sensors 100 may comprise a high reliability and lifetime.

Figure 7:
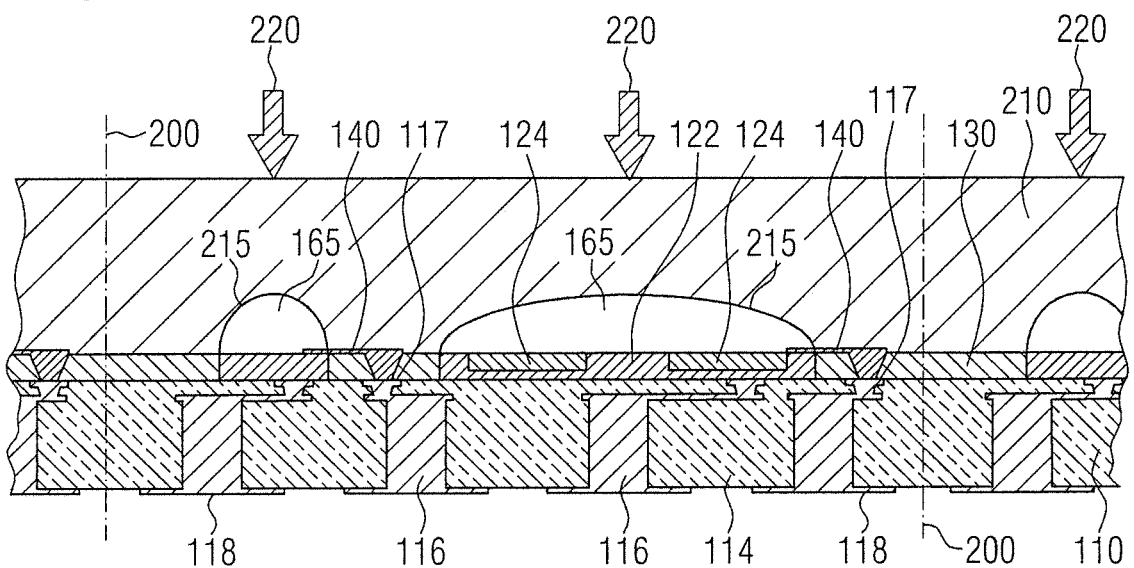
Figure 8:
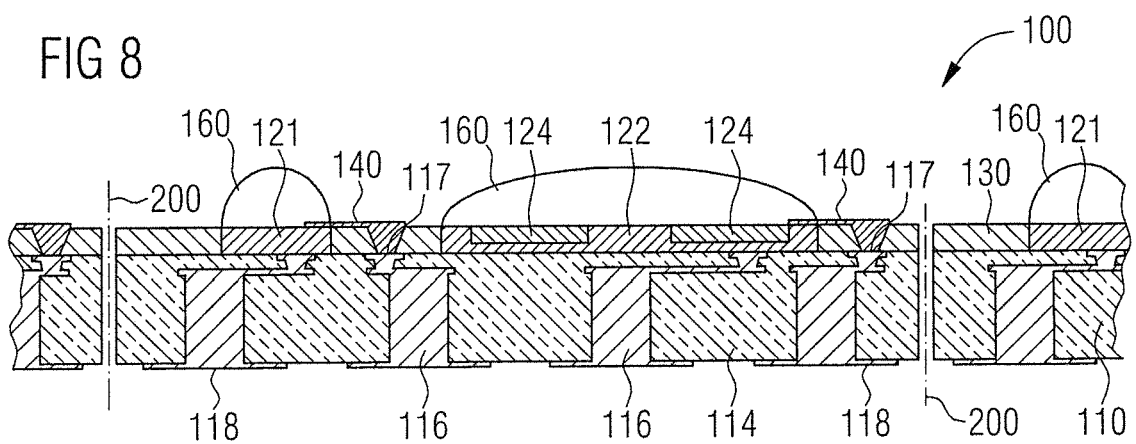
Figure 9:
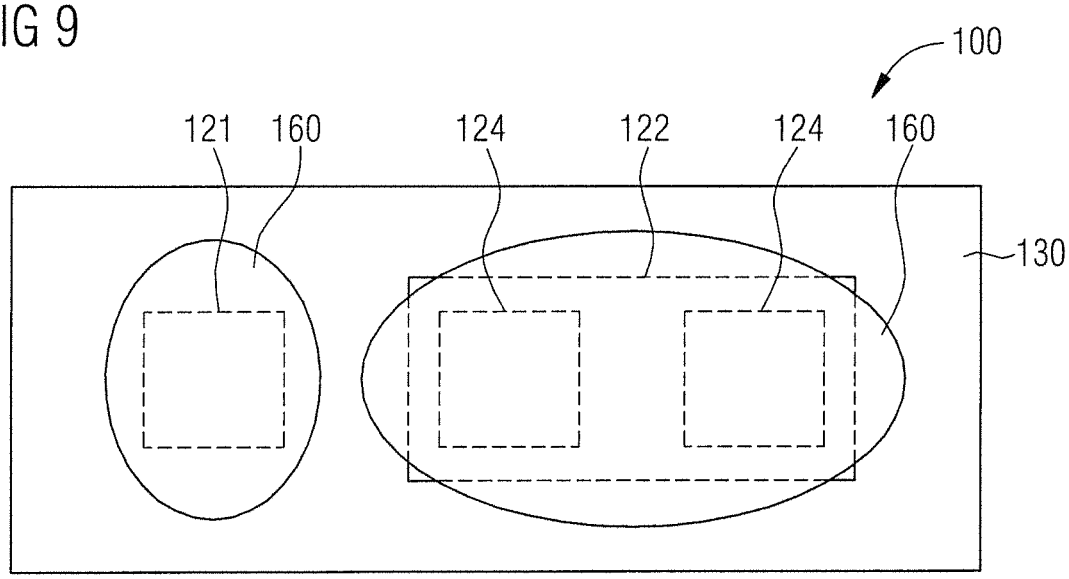
FIG. 9 shows a plan view illustration of a sensor produced by the method in FIGS. 1 to 8.

After forming the contact layers 140, as shown in FIGS. 7 and 8, radiation-transmissive optical elements 160 for beam shaping are jointly provided on the printed circuit board 110 provided with the semiconductor chips 121, 122 and the other constituents. This takes place on a surface constituted of the semiconductor chips 121, 122, the embedding layer 130, the insulating layers 150 and the contact layers 140. On account of the contact layers 140, the surface may be relatively planar and comprise a small topography. This makes it possible to produce the optical elements 160 with the aid of a molding or mold process directly and jointly on the printed circuit board 110 carrying the semiconductor chips 121, 122 and the further constituents.

In the method sequence described in this example, radiation-transmissive optical elements 160 are configured in the form of lenses comprising a curved lens surface. Such an optical element 160 is provided on each of the semiconductor chips 121, 122. The optical elements 160 arranged on the different semiconductor chips 121, 122 comprise, in accordance with the different lateral dimensions of the semiconductor chips 121, 122, different lateral dimensions and shapes adapted thereto. In an emitter 121, a shaping of the radiation emitted by the emitter 121 may be achieved with the aid of an associated optical element 160. In a detector 122, the associated optical element 160 may bring about a shaping of the radiation received by the detector 122.

As shown in FIG. 7, the optical elements 160 are produced in the molding process by the molding of a radiation-transmissive molding compound 165, which is applied in a liquid or viscous form on the printed circuit board 110 provided with the semiconductor chips 121, 122 and the other constituents, and subsequent curing of the molding compound 165. The molding compound 165 is a UV-curing molding compound that may be solidified under the influence of UV radiation 220 (ultraviolet radiation). Accordingly, the molding process is also referred to as a UV molding process or UV mold process. The UV-curing molding compound 165 may be a UV-curing radiation-transmissive plastics material such as a hybrid polymer material, for example.

For the molding process, the printed circuit board 110 provided with the semiconductor chips 121, 122 and the other constituents is received in a tool, of which only a tool part 210 provided to mold the optical elements 160 is illustrated in FIG. 7. The tool part 210, which may also be referred to as a master die, comprises at one side cavities 215 coordinated with the geometric shapes of the optical elements 160 to be produced. Furthermore, in regard to the UV molding process, the tool part 210 is transparent to the UV radiation 220 used.

It is possible to apply the molding compound 165 on the printed circuit board 110 provided with the semiconductor chips 121, 122 and the other constituents, for example, by metering with the aid of a dispenser, and subsequently to press the molding compound 165 to shape with the aid of that side of the tool part 210 comprising the cavities 215 such that the molding compound 165 assumes the shape of the optical elements 160. In this procedure, if appropriate, a flat layer of the molding compound 165 may remain between the optical elements 160 to be produced (not illustrated). Alternatively, the molding compound 165 may be introduced into the cavities 215 of the tool part 210, likewise for example, by metering with the aid of a dispenser, and may then be applied with the aid of the tool part 210 in the form of the optical elements 160 on the printed circuit board 110 carrying the semiconductor chips 121, 122 and the further constituents. These steps are carried out, as has already been indicated above, in a liquid or viscous state of the molding compound 165. For subsequent curing, the molding compound 165 is irradiated with UV radiation 220 through the tool part 210, as indicated with the aid of arrows in FIG. 7. The shape of the optical elements 160 realized with the aid of the cavities 215 of the tool part 210 may thereby be fixed. If appropriate, consideration may be given to carrying out, after the UV curing, an additional post-curing of the molding compound 165 by a thermal action to complete the solidification of the molding compound 165.

With the aid of the procedure described above, all optical elements 160 of the sensors 100 fabricated in an assemblage may be produced jointly in a parallel manner. This is associated with a time and cost advantage.

After forming the optical elements 160 or after removal from the mold as shown in FIG. 8, a singulating process is carried out to subdivide the sensor assemblage comprising the printed circuit board 110 provided with the semiconductor chips 121, 122, the embedding layer 130, the insulating layers 150, the contact layers 140, the electrical connection elements 155 possibly present (cf. FIGS. 5 and 6), and the optical elements 160 into separate sensors 100. The singulating involving severing the printed circuit board 110 and the embedding layer 130 along the separating lines 200, may be carried out by sawing, for example. Each sensor 100 comprises a section of the printed circuit board 110, a section of the embedding layer 130, an emitter 121, a detector 122 and two optical elements 160 assigned to the emitter 121 and the detector 122. The rear-side contacts and front-side contacts of the semiconductor chips 121, 122 connect to front-side contact surfaces 117 of the associated printed circuit board sections 110 and may therefore be electrically contacted via the rear-side contact surfaces 118. An electrical energy supply and, in the detectors 122, a tapping off of detector signals are possible as a result.

FIG. 9 supplementarily shows a plan view illustration of a sensor 100 produced in accordance with the method described above. With reference to FIG. 9, it becomes clear that the optical elements 160, in a departure from FIGS. 7 and 8, may be formed with somewhat larger lateral dimensions. As a result, the optical elements 160 may be arranged not only on the semiconductor chips 121, 122, but also laterally with respect thereto on constituents such as the embedding layer 130.

Further variants and modifications are described below that may be considered for optical sensors 100 and an associated production method. Corresponding features, method steps and aspects and also identical and identically acting component parts are not described in detail again below. Instead, for details in respect thereof, reference is made to the description above. Furthermore, aspects and details mentioned with regard to one configuration may also be applied with regard to another configuration and features of two or more configurations may be combined with one another.

One possible modification of the method consists, for example, of providing radiation-transmissive optical elements 181 by using an optics assemblage 180 jointly on the printed circuit board 110 provided with the semiconductor chips 121, 122 and further constituents. In this context, at least one radiation-nontransmissive barrier structure 170 may additionally be provided. The nontransmissivity relates to the radiation or light radiation emitted by the emitters 121. Crosstalk between an emitter 121 and a detector 122 of a sensor 100 may be suppressed in such a configuration. This means that it is possible to at least partly prevent the light radiation emitted by the emitter 121 from passing to the detector 122 without a predefined interaction or reflection of the light radiation emitted by the emitter 121 taking place beforehand.

Figure 10:
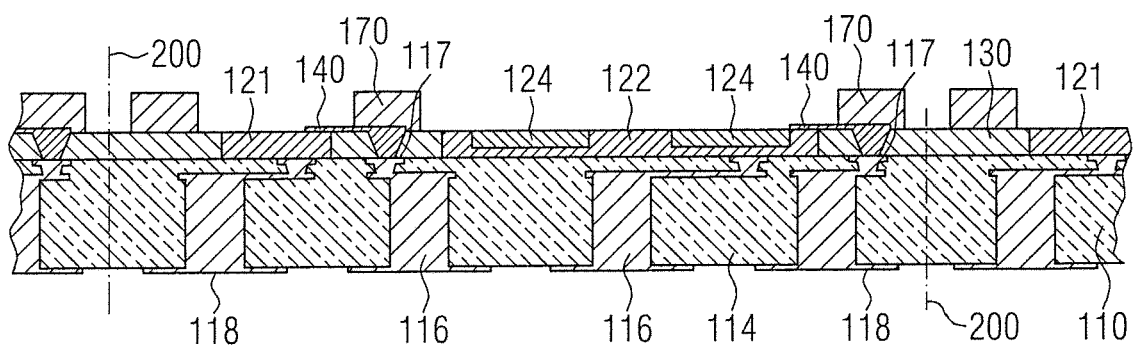
FIGS. 10 to 12 show a further method of producing sensors on the basis of lateral illustrations, wherein linear barrier structures and an optics assemblage comprising optical elements connected to one another are used.
Figure 11:
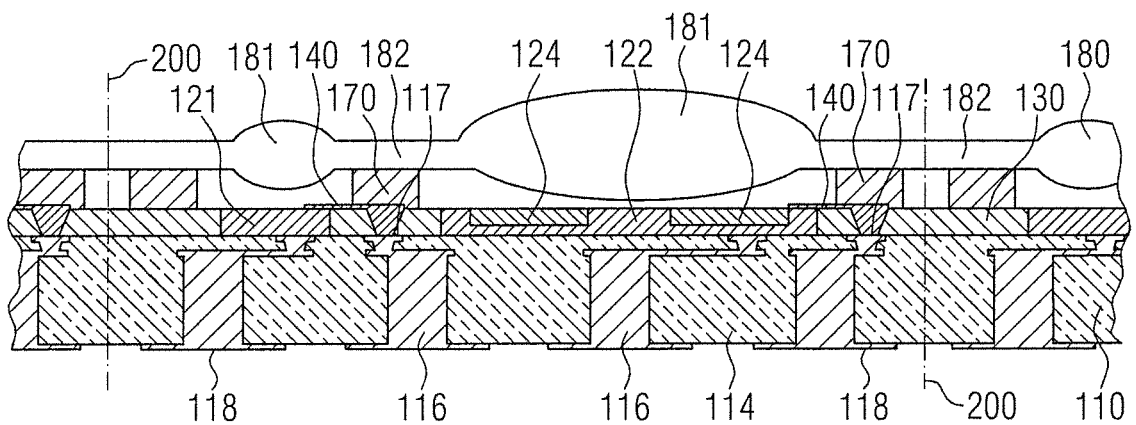
Figure 12:
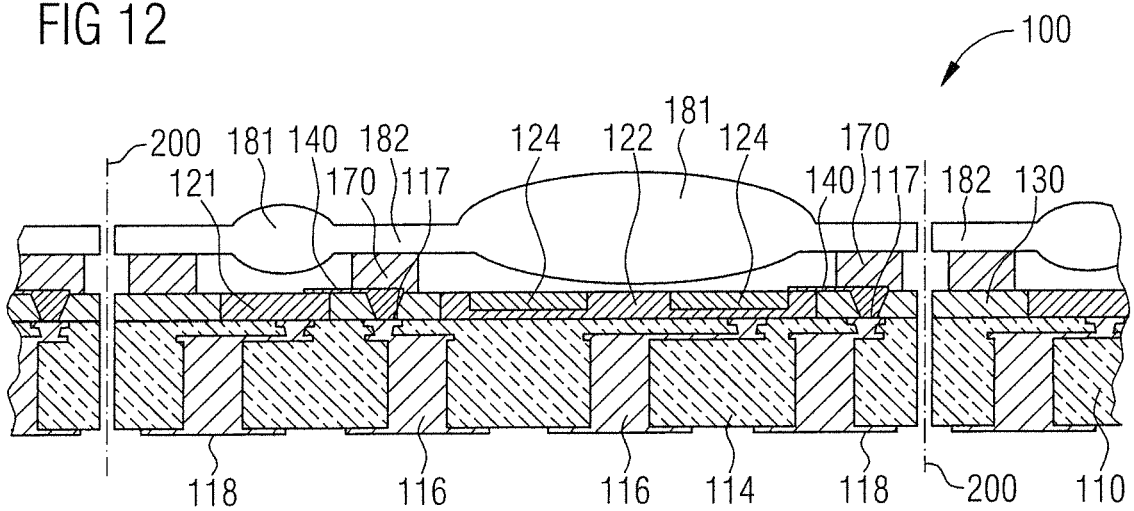

One method carried out with this aim is shown in FIGS. 10 to 12 on the basis of lateral sectional illustrations. FIGS.

13 to 15 supplementarily elucidate the method on the basis of plan view illustrations, wherein here, too, regions of sensors 100 to be produced are indicated with the aid of the separating lines 200. FIGS. 10 to 15 each show an excerpt substantially in the region of one of the sensors 100 to be produced.

Figure 13:
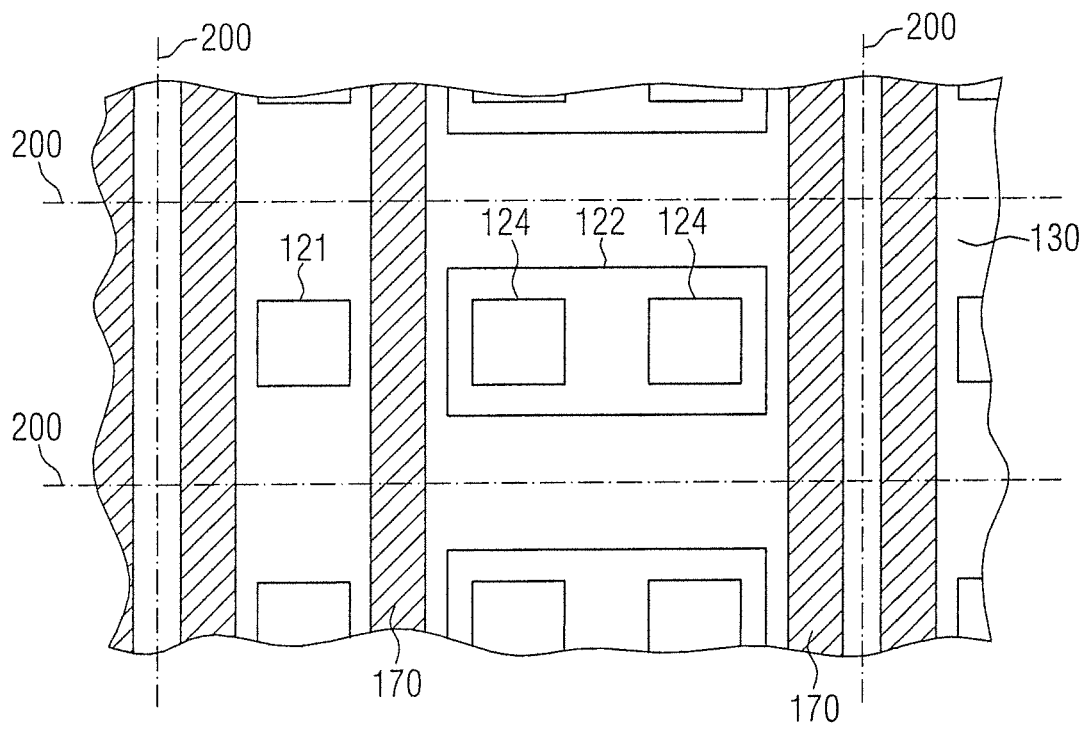
FIGS. 13 to 15 show plan view illustrations concerning the method shown in FIGS. 10 to 12.

In the method, first, the procedure as described above is adopted to provide the arrangement shown in FIG. 4, i.e., the printed circuit board 110 provided with the semiconductor chips 121, 122, the embedding layer 130, the insulating layers 150, the contact layers 140 and, if appropriate, the electrical connection elements 155 (cf. supplementarily FIGS. 5 and 6). Afterward, a plurality of radiation-nontransmissive barrier structures 170 are provided on this arrangement as shown in FIGS. 10 and 13. These are linear barrier structures 170 extending parallel to one another and are provided, relative to a plan view consideration, next to or between the semiconductor chips 121, 122. The barrier structures 170 are initially still assigned to a plurality of the sensors 100 produced in an assemblage and therefore extend over the regions of a plurality of sensors 100 (cf. FIG. 13). The barrier structures 170 may comprise a black color.

Providing the barrier structures 170 is carried out on a surface constituted of the semiconductor chips 121, 122, the embedding layer 130, the insulating layers 150 and the contact layers 140 and that may be relatively planar on account of the contact layers 140. As a result, it is possible to produce the barrier structures 170 directly and jointly on the printed circuit board 110 carrying the semiconductor chips 121, 122 and the further constituents with the aid of a molding process. This may involve adopting a procedure comparable to that of molding optical elements 160 as described above with reference to FIG. 7.

In the molding process, the barrier structures 170 are produced by molding and curing a molding compound on the printed circuit board 110 provided with the semiconductor chips 121, 122 and the other constituents. In this context, a UV molding process may likewise be carried out by using a UV-curing molding compound. This may involve a UV-curing plastics material. For the molding process, the printed circuit board 110 provided with the semiconductor chips 121, 122 and the other constituents may be received in a tool comprising a tool part comprising cavities present at one side for the molding of the barrier structures. In regard to the UV molding process, the tool part is transmissive to UV radiation. The molding compound may be introduced into the cavities of the tool part and then be applied with the aid of the tool part in the form of the barrier structures 170 on the printed circuit board 110 carrying the semiconductor chips 121, 122 and further constituents. In this example, the molding compound is in a liquid or viscous state. For subsequent curing, the molding compound is irradiated with UV radiation through the tool part. The shape of the barrier structures 170 realized with the aid of the cavities of the tool part may be fixed in this way. It is furthermore possible, if appropriate, to carry out, after the UV curing, an additional post-curing of the molding compound by a thermal action to complete the solidification of the molding compound (not each illustrated).

Figure 14:
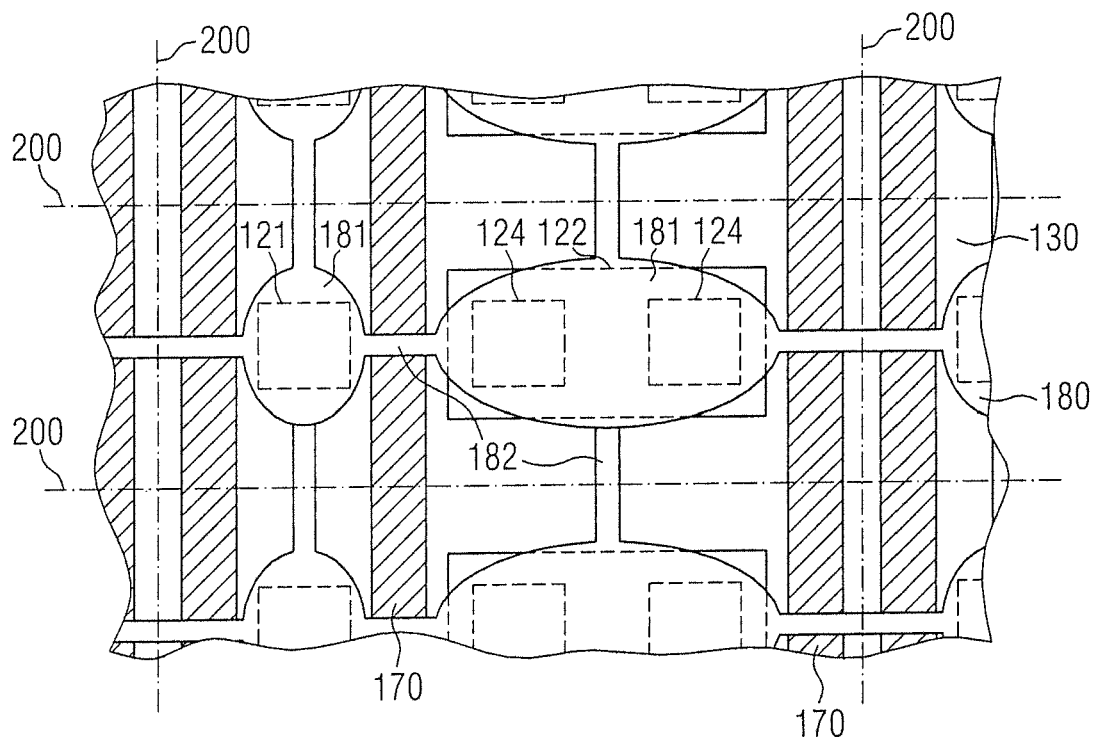

Afterward, as shown in FIGS. 11 and 14, a separately produced radiation-transmissive optics assemblage 180 is mounted on the barrier structures 170. The optics assemblage 180 is formed, for example, from a radiation-transmissive plastics material and comprises optical elements 181 for beam shaping and connection webs 182, via which adjacent optical elements 181 connect to one another. In this example, the optical elements 181 are lenses comprising a curved surface at two opposite sides. The optics assemblage 180 is arranged with the connection webs 182 on the barrier structures 170 and is secured thereon, for example, with the aid of an adhesive, not illustrated.

The optics assemblage 180 may comprise a size and a number of optical elements 181 corresponding to the number of semiconductor chips 121, 122 such that, as a result of arranging the optics assemblage 180, all optical elements 181 of the sensors 100 fabricated in an assemblage are provided jointly on the printed circuit board 110 provided with the semiconductor chips 121, 122 and further constituents. This is associated with a time and cost advantage. The optics assemblage 180 may furthermore be coordinated with the positions of the semiconductor chips 121, 122 such that a corresponding optical element 181 becomes located above each semiconductor chip 121, 122 as a result of the mounting of the optics assemblage 180. The optical elements 181 assigned to the different semiconductor chips 121, 122 comprise, in accordance with the different lateral dimensions of the semiconductor chips 121, 122, different lateral dimensions and shapes adapted thereto. In an emitter 121, a shaping of the radiation emitted by the emitter 121 may be achieved with the aid of an associated optical element 181. In a detector 122, the associated optical element 181 may bring about a shaping of the radiation received by the detector 122.

Figure 15:
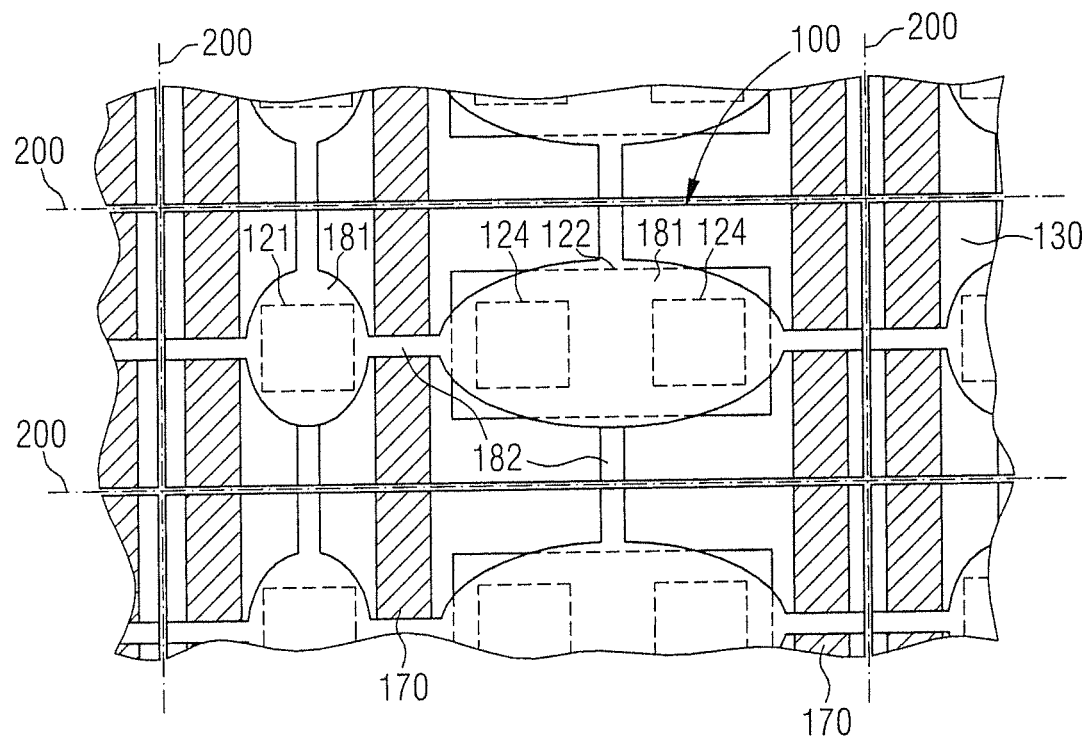

The sensor assemblage present after arranging the optics assemblage 180 is subsequently singulated into separate sensors 100. This is carried out as shown in FIGS. 12 and 15, by severing along the separating lines 200. This process involves not only severing the printed circuit board 110 and the embedding layer 130, but also severing the barrier structures 170, which in this respect are distributed among individual sensors 100. This applies in the same way to the optics assemblage 180 in which severing takes place at a portion of the connection webs 182.

A singulated sensor 100 comprising the construction shown in FIGS. 12 and 15 comprises three elongate or web-shaped light-blocking barrier structures 170, in contrast to the design shown in FIGS. 8 and 9. The barrier structures 170 are arranged on the surface constituted by the semiconductor chips 121, 122, the embedding layer 130, the insulating layers 150 and the contact layers 140. Relative to a plan view consideration of a sensor 100, two barrier structures 170 are located in the region of opposite ends of the sensor 100 and thus laterally next to the emitter 121 and laterally next to the detector 122, and a central barrier structure 170 is present in a region between the semiconductor chips 121, 122 (cf. FIG. 15). The above-described suppression of crosstalk may be achieved principally with the aid of the central barrier structure 170.

A sensor 100 shown in FIGS. 12 and 15 furthermore comprises two optical elements 181 connected to one another and which, via connection webs 182, are secured on the barrier structures 170 and thereby held above the semiconductor chips 121, 122. The optical elements 181 are realized in the form of lenses comprising a curved surface at two opposite sides.

Figure 16:
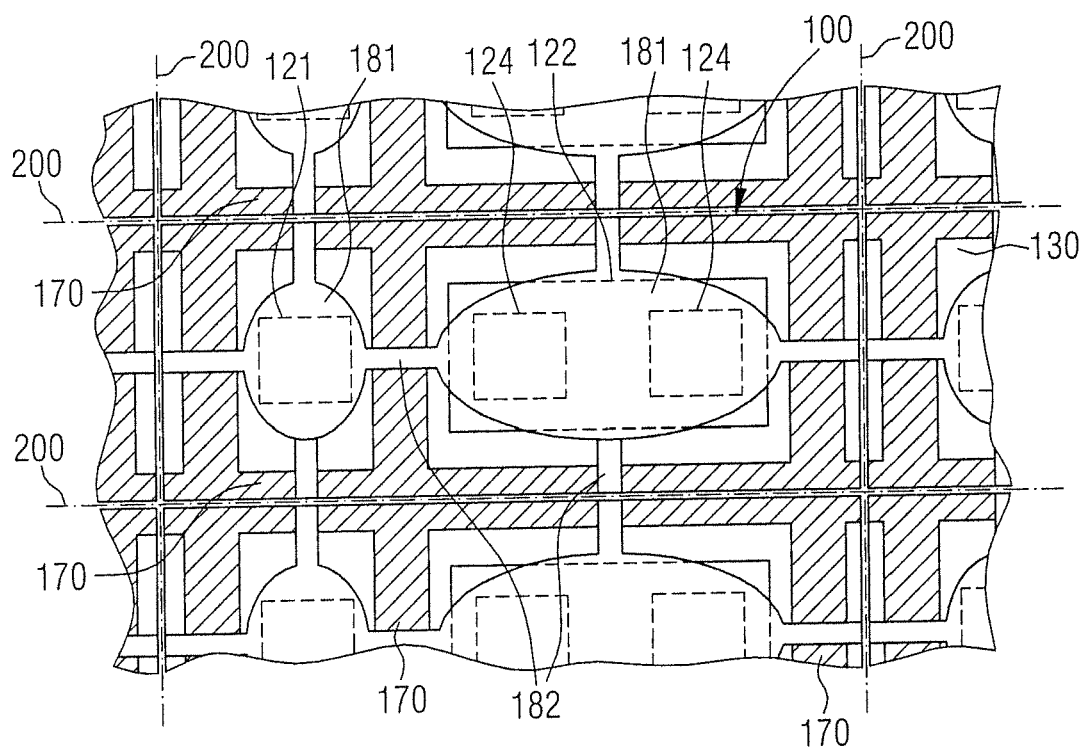
FIG. 16 shows a plan view illustration elucidating a modification of the method shown in FIGS. 10 to 15, wherein a lattice-shaped barrier structure is used.

One possible modification of the method explained with reference to FIGS. 10 to 15 consists of providing, instead of separate radiation-nontransmissive barrier structures 170, a continuous barrier structure 170 on the printed circuit board 110 provided with the semiconductor chips 121, 122 and the further constituents. This may involve, for example, a lattice-shaped barrier structure 170 as illustrated in the plan view illustration in FIG. 16. The lattice-shaped barrier structure 170 may initially be assigned to all of the sensors 100 produced in an assemblage. FIG. 16 shows a state already after the singulating.

The lattice-shaped barrier structure 170 comprises, relative to a plan view consideration, a configuration extending in a frame-shaped fashion around the emitter 121 and the detector 122 of a sensor 100 to be produced. In this example, the barrier structure 170 comprises recesses coordinated with the semiconductor chips 121, 122 and via which the semiconductor chips 121, 122 are freed. Producing the barrier structure 170 may be carried out as indicated above with the aid of a molding process or UV molding process. Afterward, the optics assemblage 180 may be adhesively bonded with the connection webs 182 thereof onto the barrier structure 170. In the singulating step, the barrier structure 170 and the optics assemblage 180 may be severed and thus distributed among the individual sensors 100. In a singulated sensor 100, the barrier structure 170 comprises, relative to a plan view consideration, a configuration each extending in a frame-shaped fashion around the emitter 121 and the detector 122 of the sensor 100.

The methods explained with reference to FIGS. 10 to 16 may furthermore be modified such that the barrier structures 170 described above are not produced directly with the aid of a molding process on the printed circuit board 110 provided with the semiconductor chips 121, 122 and further constituents, rather that the plurality of linear barrier structures 170 or the lattice-shaped barrier structure 170 are/is instead produced separately and arranged on the surface constituted of the semiconductor chips 121, 122, the embedding layer 130, the insulating layers 150 and the contact layers 140, for example, by adhesive bonding. Afterward, the further steps such as mounting the optics assemblage 180 and singulating may be carried out in an analogous manner.

Furthermore, the possibility is afforded of fabricating the optics assemblage 180 such that the optics assemblage 180 itself comprises one or a plurality of radiation-nontransmissive barrier structures 170. In accordance with the configurations described above, by way of example, a plurality of linear barrier structures 170 or a continuous lattice-shaped barrier structure 170 may be provided on the optics assemblage 180. For this purpose, by way of example, the optics assemblage 180 and the at least one barrier structure 170 may be fabricated separately and connect to one another, for example, by adhesive bonding. In this example, the at least one barrier structure 170 may be arranged on one side of the optics assemblage 180 and connect to connection webs 182 of the optics assemblage. The optics assemblage 180 provided in this way may be arranged with the at least one barrier structure 170 on the surface constituted of the semiconductor chips 121, 122, the embedding layer 130, the insulating layers 150 and the contact layers 140, for example, by adhesive bonding, with the result that a state as shown in section in FIG. 11 may be present. By singulating the sensor assemblage constituted thereof, which, in accordance with FIGS. 12 and 15 or 16, is associated with severing the printed circuit board 110, the embedding layer 130, the at least one barrier structure 170 and the optics assemblage 180, it is possible to produce separate sensors 100 comprising the construction described above.

Figure 17:
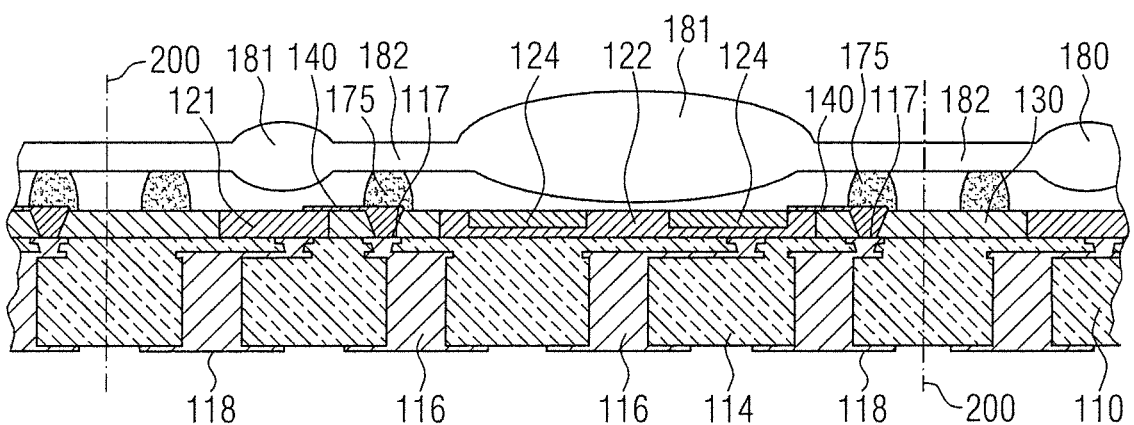
FIGS. 17 to 18 show a further method of producing sensors on the basis of lateral illustrations, wherein an optics assemblage is mounted using a radiation-nontransmissive adhesive.
Figure 18:
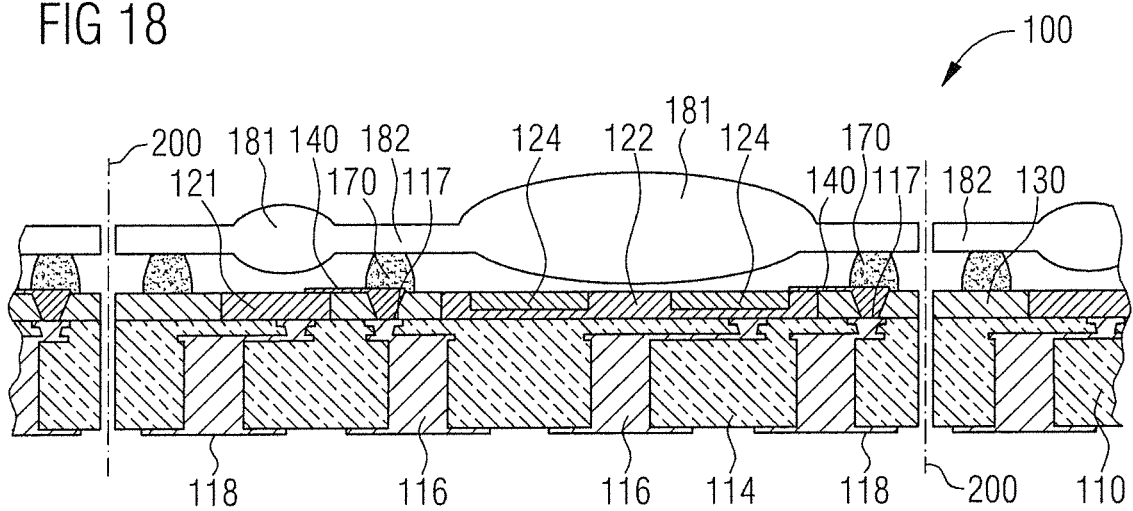

FIGS. 17 and 18 show, on the basis of lateral sectional illustrations, a further method sequence of producing sensors 100 using the separately produced radiation-transmissive optics assemblage 180. In this example, too, initially the procedure as described above is adopted to provide the arrangement shown in FIG. 4. Afterward, the optics assemblage 180 is mounted, using a radiation-nontransmissive adhesive 175, on this arrangement or on the surface constituted of the semiconductor chips 121, 122, the embedding layer 130, the insulating layers 150 and the contact layers 140. This is carried out such that a corresponding optical element 181 becomes located above each semiconductor chip 121, 122.

The adhesive 175 may comprise a black color, for example, and be an epoxy or silicone adhesive, for example. The adhesive 175 may be applied in liquid or viscous form on the printed circuit board 110 provided with the semiconductor chips 121, 122 and the further constituents. Afterward, the optics assemblage 180 may be arranged with the connection webs 182 thereof on the adhesive 175. By curing the adhesive 175, it is possible to secure the optics assemblage 180 on the printed circuit board 110 carrying the semiconductor chips 121, 122 and further constituents.

The cured adhesive 175 may simultaneously constitute one or a plurality of radiation-nontransmissive barrier structures 170. For this purpose, the adhesive 175, in accordance with the configurations described above may be applied, for example, in the form of a plurality of parallel lines or a lattice on the printed circuit board 110 provided with the semiconductor chips 121, 122 and further constituents. By singulating the sensor assemblage constituted thereof as shown from the side in FIG. 18, wherein conditions corresponding to FIG. 15 or 16 may be present as viewed from above, it is possible to produce separate sensors 100.

In a further modification of the method, sensors 100 are produced in which front-side contacts of semiconductor chips 121, 122 electrically connect to contact surfaces 117 of the printed circuit board 110 not via contact layers 140 and possibly electrical connection elements 155 (cf. FIGS. 5 and 6), but instead via bond wires 190. Possible configurations are explained in greater detail below with reference to FIGS. 19 to 24.

Figure 19:
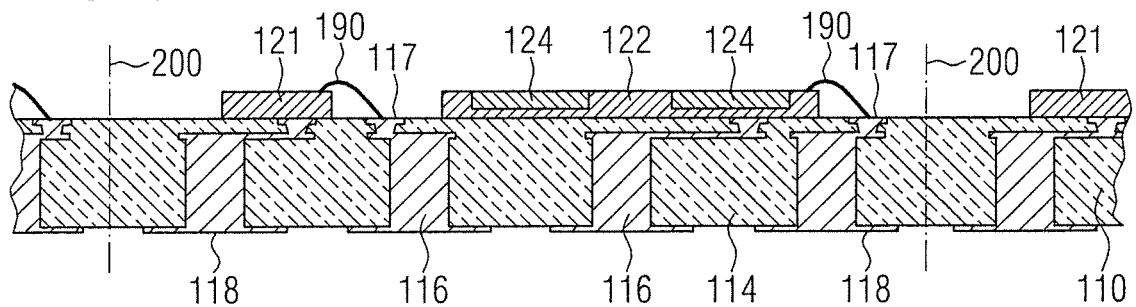
FIGS. 19 to 21 show a further method of producing sensors on the basis of lateral illustrations, wherein bond wires are used to contact front-side contacts of semiconductor chips and an optics assemblage is mounted using a radiation-nontransmissive adhesive.
Figure 20:
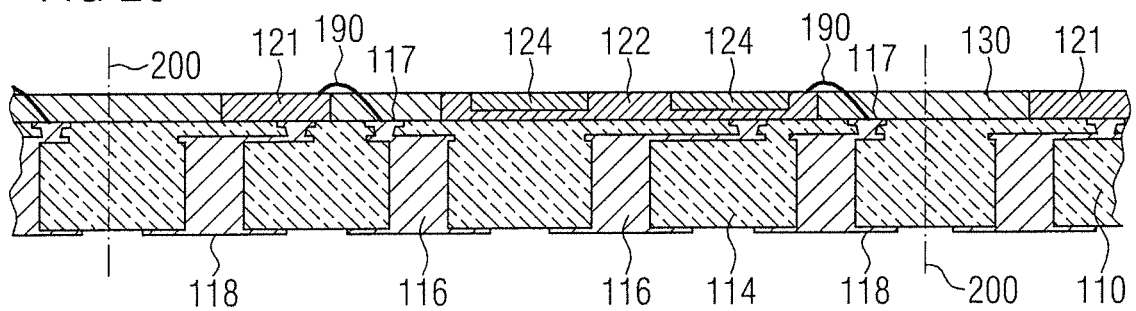
Figure 21:
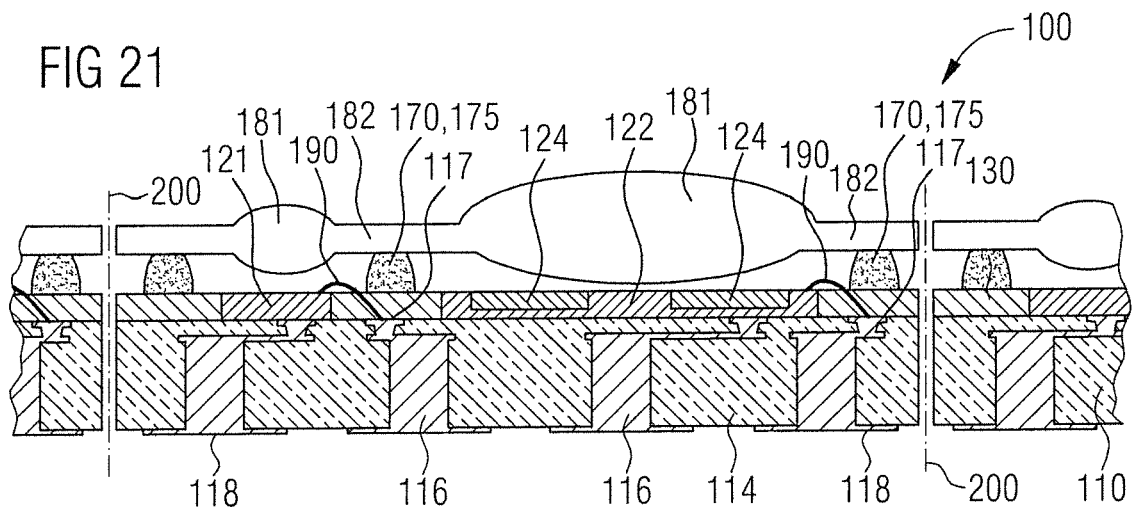

FIGS. 19 to 21 show a method carried out with this aim on the basis of lateral sectional illustrations. As illustrated in FIG. 19, first, the printed circuit board 110 comprising conductor structures 116 is provided, and radiation-emitting and radiation-detecting semiconductor chips 121, 122 are mounted on the front side of the printed circuit board 110. The semiconductor chips 121, 122 comprise, as indicated above, a rear-side contact and a front-side contact (not illustrated). In the context of chip mounting, the semiconductor chips 121, 122 may electrically connect to front-side contact surfaces 117 of the printed circuit board 110 via the rear-side contacts of the semiconductor chips and an electrically conductive connection means, not illustrated. With regard to the front-side contacts of the semiconductor chips 121, 122, a wire bonding process is carried out. In this example, the front-side contacts of the semiconductor chips 121, 122 electrically connect to further front-side contact surfaces 117 of the printed circuit board 110 via bond wires 190.

After chip mounting and wire bonding as shown in FIG. 20, the embedding layer 130 that laterally adjoins the semiconductor chips 121, 122 or circumferentially encloses the semiconductor chips 121, 122 and extends as far as front sides of the semiconductor chips 121, 122, is formed on the printed circuit board 110. In this configuration, the bond wires 190 are partly embedded in the embedding layer 130 and partly project from the embedding layer 130. As was described above, the embedding layer 130 may be formed from a black or white plastics material. The plastics material may be applied in liquid or viscous form on the printed circuit board 110 provided with the semiconductor chips 121, 122 and may subsequently be cured. To apply the plastics material, it is possible to carry out a potting process with the aid of a circumferential wall formed or arranged on the printed circuit board 110 (not illustrated).

Afterward, jointly providing radiation-transmissive optical elements on the printed circuit board 110 provided with the semiconductor chips 121, 122 and further constituents may be carried out. FIG. 21 illustrates in this respect the mounting (explained above with reference to FIGS. 17 and 18) of an optics assemblage 180 comprising optical elements 181 using a radiation-nontransmissive adhesive 175. In this example, the adhesive 175 may be applied in liquid or viscous form on the printed circuit board 110 provided with the semiconductor chips 121, 122 and the further constituents and/or on the embedding layer 130, for example, in the form of a plurality of parallel lines or a lattice, and the optics assemblage 180 may subsequently be arranged with the connection webs 182 thereof on the adhesive 175. By curing the adhesive 175, the optics assemblage 180 may be fixed, and one or a plurality of radiation-nontransmissive barrier structures 170 may be formed from the adhesive 175. By singulating the sensor assemblage constituted thereof as likewise shown in FIG. 21, wherein conditions corresponding to FIG. 15 or 16 may be present as viewed from above, it is possible to produce separate sensors 100.

Modifications such as have been explained above are likewise available for the method explained with reference to FIGS. 19 to 21. It is possible, for example, after forming the embedding layer 130, to arrange one or a plurality of separately produced barrier structures 170 on the printed circuit board 110 carrying the semiconductor chips 121, 122 and further constituents, for example, by adhesive bonding. A plurality of linear barrier structures 170 or a lattice-shaped barrier structure 170 may be used in accordance with the configurations described above. The optics assemblage 180 may be arranged thereon likewise, for example, by adhesive bonding. Afterward, the sensor assemblage may be singulated into separate sensors 100 (not each illustrated).

In a corresponding manner, with regard to the method in FIGS. 19 to 21, the possibility is afforded of using an optics assemblage 180 comprising one or a plurality of barrier structures 170, that is to say, for example, one lattice-shaped or a plurality of linear barrier structures 170, at one side. In this example, the optics assemblage 180 with the at least one barrier structure 170 may be arranged on the printed circuit board 110 provided with the semiconductor chips 121, 122 and the further constituents, for example, by adhesive bonding. The sensor assemblage may subsequently be singulated into separate sensors 100 (not each illustrated).

Figure 22:
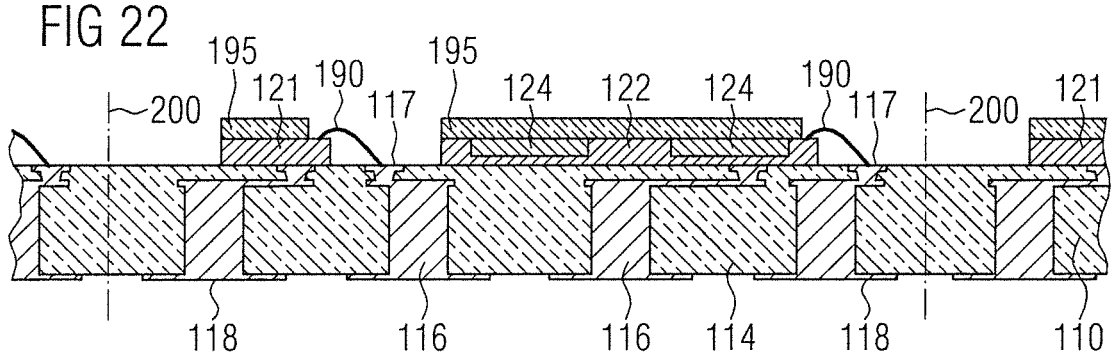
FIGS. 22 to 24 show a further method of producing sensors on the basis of lateral illustrations, wherein use is made of bond wires for contacting front-side contacts of semiconductor chips and radiation-transmissive elements on semiconductor chips, and wherein optical elements are produced with the aid of a molding process.
Figure 23:
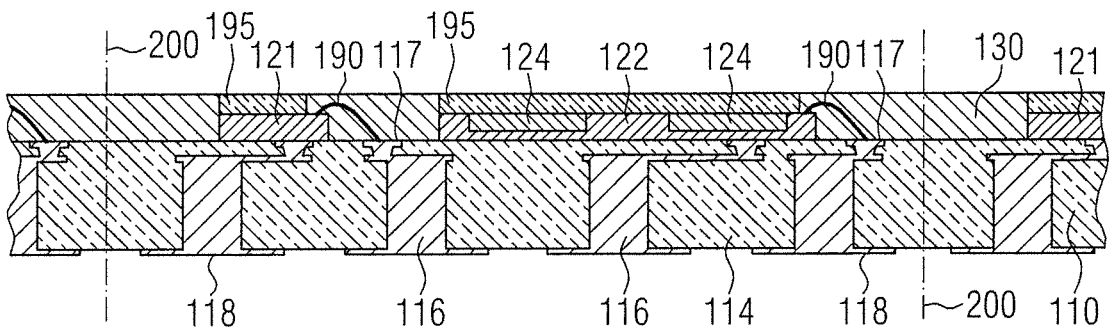
Figure 24:
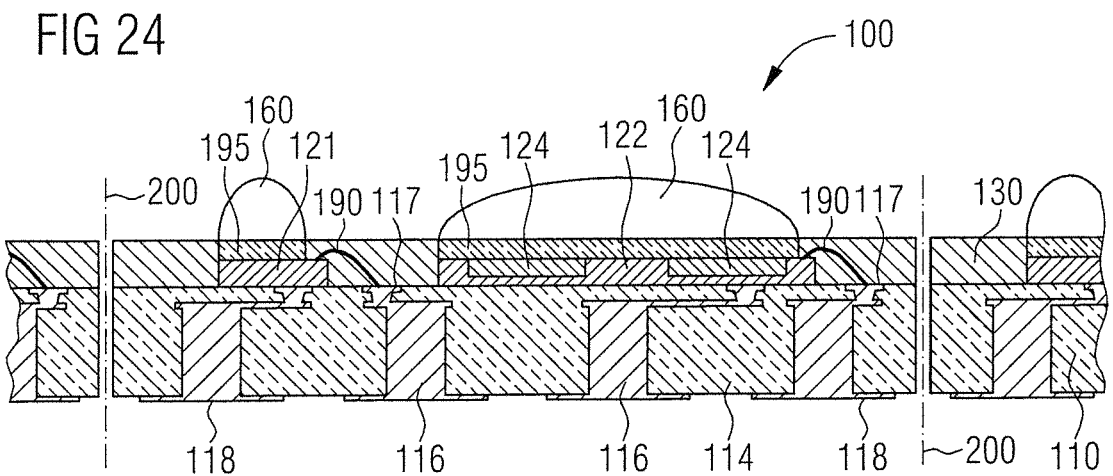

FIGS. 22 to 24 show, on the basis of lateral sectional illustrations, a further method in which wire bonding is applied. As illustrated in FIG. 22, first, the printed circuit board 110 comprising conductor structures 116 is provided, and radiation-emitting and radiation-detecting semiconductor chips 121, 122 are mounted on the front side of the printed circuit board 110. The semiconductor chips 121, 122 comprise, as indicated above, a rear-side contact and a front-side contact (not illustrated). In the context of chip mounting, the semiconductor chips 121, 122 may electrically connect to front-side contact surfaces 117 of the printed circuit board 110 via the rear-side contacts of the semiconductor chips and an electrically conductive connection means, not illustrated. The front-side contacts of the semiconductor chips 121, 122 electrically connect to further front-side contact surfaces 117 of the printed circuit board 110 via bond wires 190.

FIG. 22 furthermore illustrates that a radiation-transmissive element 195 is arranged on the front side of each semiconductor chip 121, 122. An adhesive, not illustrated, may be used for securing purposes. In the completed sensors 100, the radiation-transmissive elements 195 ensure that the semiconductor chips 121, 122 may still receive and/or emit a light radiation. The radiation-transmissive elements 195, which project beyond the bond wires 190 may, for example, be formed from a glass material and comprise a laminar shape. In accordance with the different lateral dimensions of the semiconductor chips 121, 122, the radiation-transmissive elements 195 arranged on the different semiconductor chips 121, 122 comprise different lateral dimensions. The radiation-transmissive elements 195 furthermore comprise dimensions and are positioned on the semiconductor chips 121, 122 such that the front-side contacts of the semiconductor chips 121, 122 are uncovered.

With regard to the arrangement shown in FIG. 22, the processes described above may be carried out in the following order. First, the semiconductor chips 121, 122 may be arranged on the printed circuit board 110. Also afterward, the radiation-transmissive elements 195 may be positioned on the semiconductor chips 121, 122. Afterward, the wire bonding may be carried out. Alternatively, it is possible, for example, to arrange the radiation-transmissive elements 195 on the semiconductor chips 121, 122 before chip mounting, and carry out the wire bonding after chip mounting.

Afterward, as shown in FIG. 23, forming the embedding layer 130 is carried out. In this configuration, the embedding layer 130 is produced such that the semiconductor chips 121, 122 and the bond wires 190 are encapsulated and the embedding layer 130 extends as far as front sides of the radiation-transmissive elements 195. In this example, the embedding layer 130 laterally adjoins the radiation-transmissive elements 195 or the latter are circumferentially enclosed by the embedding layer 130.

Forming the embedding layer 130 may be carried out in the manner described above. The embedding layer 130 may be formed from a black or white plastics material, for example. The plastics material may be applied in liquid or viscous form on the printed circuit board 110 provided with the semiconductor chips 121, 122 and the radiation-transmissive elements 195 and may subsequently cure. A molding process, for example, a film assisted transfer molding process, may be carried out for this purpose. To that end, the printed circuit boards 110 provided with the semiconductor chips 121, 122 and the radiation-transmissive elements 195 may be received in a tool comprising a tool part with a film arranged thereon. In the transfer molding process, the tool part with the film may be pressed onto the front sides of the radiation-transmissive elements 195. In this way, the plastics material may be applied on the printed circuit board 110 such that the semiconductor chips 121, 122 and the bond wires 190 are enclosed by the plastics material and the plastics material laterally adjoins the radiation-transmissive elements 195. To apply the plastics material of the embedding layer 130, alternatively it is also possible to carry out a potting process with the aid of a circumferential wall formed or arranged on the printed circuit board 110. If radiation-transmissive elements 195 are covered with the plastics material on the front side in an undesired manner after the process of forming the embedding layer 130, it is furthermore possible to carry out a cleaning step for uncovering covered radiation-transmissive elements 195 (not each illustrated).

Afterward, jointly providing radiation-transmissive optical elements on the printed circuit board 110 provided with the semiconductor chips 121, 122 and further constituents may be carried out. This process takes place on a surface constituted of the radiation-transmissive elements 195 and the embedding layer 130. In this way, the surface may be planar. As a result, it is possible to produce optical elements 160, as described above, with the aid of a molding process or UV molding process directly and jointly on the printed circuit board 110 carrying the semiconductor chips 121, 122 and the further constituents. Such a configuration comprising optical elements 160 in the form of lenses comprising a curved lens surface is illustrated in FIG. 24. In this example, above each semiconductor chip 121, 122 a corresponding optical element 160 is arranged on a radiation-transmissive element 195. For further details concerning the process of forming the optical elements 160 with the aid of a molding process, reference is made to the description concerning FIG. 7. By singulating the sensor assemblage constituted thereof as likewise shown in FIG. 21, it is possible to produce separate sensors 100.

Modifications such as have been explained above are likewise available for the method explained with reference to FIGS. 22 to 24. It is possible, for example, to provide radiation-transmissive optical elements 181 by using an optics assemblage 180 jointly on the printed circuit board 110 provided with the semiconductor chips 121, 122 and further constituents. In this context, one or a plurality of radiation-nontransmissive barrier structures 170 may additionally be provided.

It is possible, for example, in accordance with the method sequences explained with reference to FIGS. 10 to 16, to provide one or a plurality of barrier structures 170 on the surface constituted of the radiation-transmissive elements 195 and the embedding layer 130, for example, by carrying out a molding process or arranging or adhesively bonding one or a plurality of separately produced barrier structures 170. The optics assemblage 180 may be arranged thereon, likewise by adhesive bonding, for example. Afterward, the sensor assemblage may be singulated into separate sensors 100 (not each illustrated).

In a corresponding manner, the possibility is afforded of using an optics assemblage 180 comprising one or a plurality of barrier structures 170 at one side. In this example, the optics assemblage 180 with the at least one barrier structure 170 may be arranged on the surface constituted of the radiation-transmissive elements 195 and the embedding layer 130, for example, by adhesive bonding. The singulating into separate sensors 100 may subsequently be carried out (not each illustrated).

A further alternative is a procedure in accordance with FIGS. 17 and 18, that is to say arranging the optics assemblage 180 on the surface constituted by the radiation-transmissive elements 195 and the embedding layer 130 using a radiation-nontransmissive adhesive 175. By curing the adhesive applied in liquid or viscous form, the optics assemblage 180 may be secured on the printed circuit board 110 provided with the semiconductor chips 121, 122 and the further constituents, and one or a plurality of barrier structures 170 may be formed. The sensor assemblage may subsequently be singulated into separate sensors 100 (not each illustrated).

The method sequences described above may be applied in a corresponding manner to produce sensors 100 that, in a departure from the configurations described above and depicted in the figures, comprise different numbers of emitters 121 and/or detectors 122. In this context, it is possible to use, instead of detectors 122 comprising a plurality of detection regions 124, separate detectors 122 that may be configured to detect radiation in different wavelength ranges. Furthermore, emitters 121 configured to emit visible light radiation may be applied, for example.

The method sequences described above may furthermore be modified such that sensors 100 comprising only one detector 122 are fabricated. For this purpose, only detectors 122 may be arranged on the printed circuit board 110, and a sensor assemblage present at the end of the method may be singulated into sensors 100 comprising a single detector 122.

Figure 25:
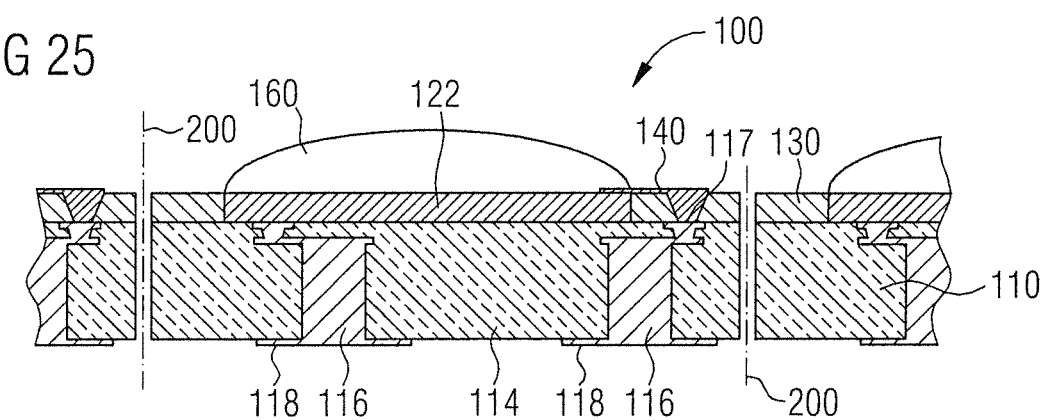
FIG. 25 shows singulating of sensors comprising an individual semiconductor chip.

For example, FIG. 25 shows singulation of a sensor assemblage into sensors 100 comprising only one detector 122. Method steps in accordance with the method explained with reference to FIGS. 1 to 9 were carried out beforehand. The detector 122 of such a sensor 100 is located on a section of the printed circuit board 110, and electrically connects to front-side contact surfaces 117 of the printed circuit board 110 in the manner described above. The detector 122 is circumferentially enclosed by a section of the embedding layer 130. A radiation-transmissive optical element 160 formed by a molding process in the form of a lens comprising a curved surface is located on the detector 122.

The method sequences described above may furthermore be modified such that a leadframe-based carrier plate 110 is used instead of a printed circuit board or a PCB substrate. For example, FIGS. 26 to 29 show a further method carried out with this aim on the basis of lateral sectional illustrations. Apart from the use of the leadframe-based carrier plate 110, this method corresponds to the method explained with reference to FIGS. 1 to 9.

The method involves providing a metallic leadframe 250 as shown as an excerpt in FIG. 1. The leadframe 250 comprises leadframe sections 251 arranged next to one another and web-shaped connection structures 252, only two connection structures 252 of which are indicated by dashed lines in the sectional view in FIG. 26. The conditions illustrated here may be present in a multiply repeating manner next to one another in a plane. In this context, further connection structures 252 extending out of the sectional plane in FIG. 26 and into the sectional plane may be provided that connect to further leadframe sections 251 (not illustrated). The leadframe sections 251 of different sensors from among the sensors 100 to be produced connect to one another via the connection structures 252.

Figure 26:
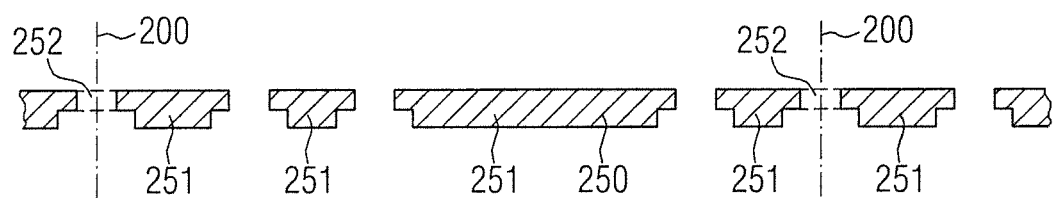
FIGS. 26 to 29 show a further method of producing sensors on the basis of lateral illustrations, wherein a leadframe-based carrier plate is used.

As indicated in FIG. 26, the leadframe sections 251 may comprise a stepped shape at the edge. An anchoring with an insulating plastics material 254 subsequently used to provide the carrier plate 110 may be achieved in this way.

Figure 27:
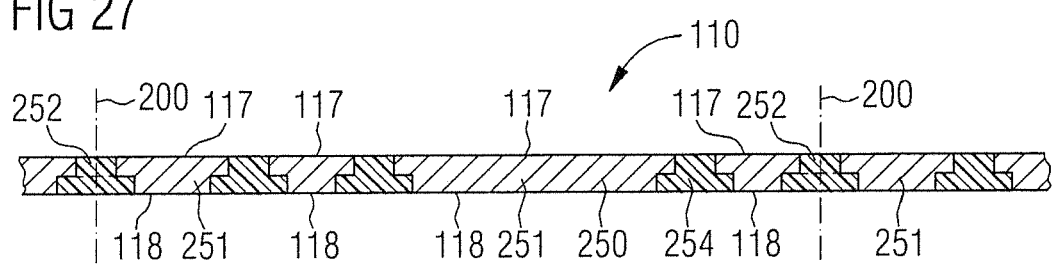

As illustrated in FIG. 27, the plastics material 254 is molded around the leadframe 250 such that the carrier plate 110 constituted thereof comprises two planar opposite main sides constituted by the leadframe 250 and the plastics material 254. The side directed toward the top in the figures is a front side, and the side directed toward the bottom is a rear side of the carrier plate 110. Interspaces of the leadframe 250, that is to say between the leadframe sections 251 and the connection structures 252, are closed off with the aid of the plastics material 254. Molding the plastics material 254 around the leadframe 250 may be carried out with the aid of a molding process such as, for example, a transfer molding process (not illustrated). In the leadframe-based carrier plate 110, the leadframe sections 251 constitute front-side accessible contact surfaces 117 and rear-side accessible contact surfaces 118.

Figure 28:
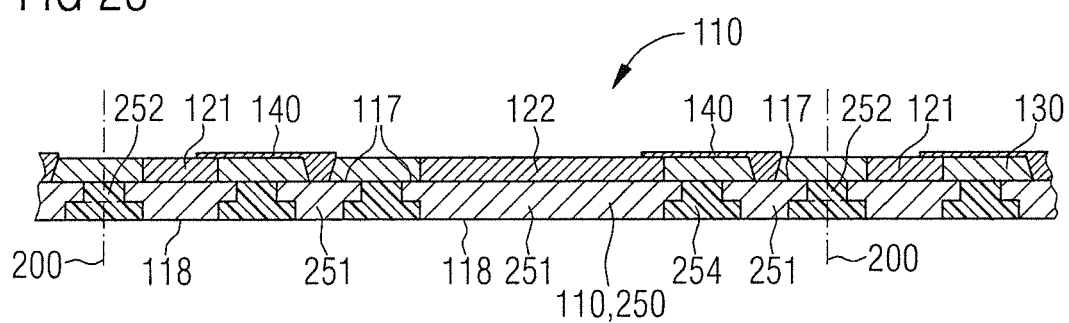

After providing the leadframe-based carrier plate 110, further steps from among those already explained above are carried out. As illustrated in FIG. 28, semiconductor chips 121, 122 are mounted on the front side of the carrier plate 110 or on leadframe sections 215, and an embedding layer 130 laterally adjoining the semiconductor chips 121, 122 is formed on the carrier plate 110. In the context of chip mounting, the semiconductor chips 121, 122 may electrically connect to front-side contact surfaces 117 of the corresponding leadframe sections 251 via the rear-side contacts of the semiconductor chips and an electrically conductive connection means. Furthermore, the front-side contacts of the semiconductor chips 121, 122 electrically connect to front-side contact surfaces 117 of further leadframe sections 251 of the carrier plate 110. Contact layers 140 are used in this example as indicated in FIG. 28. Features and aspects mentioned above may be applied in a corresponding manner in this context. By way of example, before forming the contact layers 140, insulating layers 150 may be formed to avoid short circuits in the region of the semiconductor chips 121, 122. The front-side contacts may connect to contact surfaces 117 exclusively via the contact layers 140, wherein cutouts 135 are formed in the embedding layer 130 beforehand. It is also possible to connect the front-side contacts to contact surfaces 117 via contact layers 140 and electrical connection elements 155, wherein the electrical connection elements 155 are arranged on contact surfaces 117 of the carrier plate 110 before the process of forming the embedding layer 130. For further details, reference is made to the above description concerning FIGS. 5 and 6 may be applied analogously here.

Figure 29:
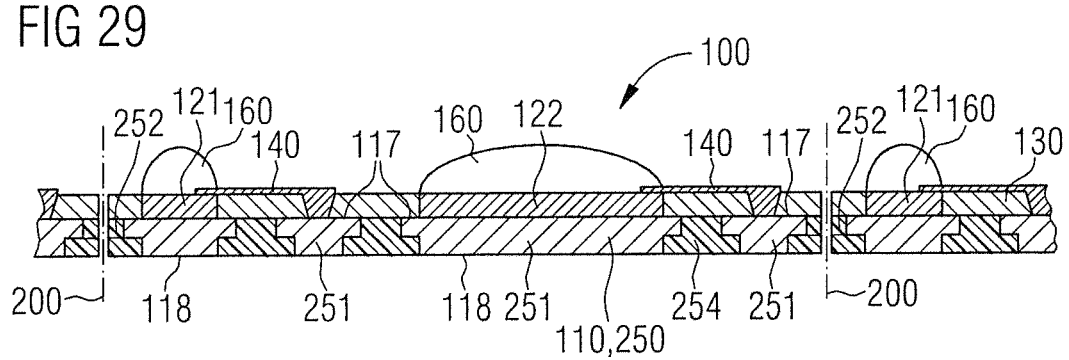

Afterward, as shown in FIG. 29, radiation-transmissive optical elements 160 in the form of lenses comprising a curved surface are produced on the carrier plate 110 provided with the semiconductor chips 121, 122 and the further constituents or on the surface constituted by the semiconductor chips 121, 122, the embedding layer 130, the insulating layers 150 and the contact layers 140. The optical elements 160 provided on each of the semiconductor chips 121, 122 may be produced in a parallel manner jointly with the aid of a molding process or UV molding process as described above. For further details, reference is made to the above description concerning FIG. 7.

Afterward, as likewise shown in FIG. 29, a singulating process is carried out to subdivide the sensor assemblage present after forming the optical elements 160 into separate sensors 100. In this example, the carrier plate 110 and the embedding layer 130 are severed along the separating lines 200. With regard to the carrier plate 110, the severing is carried out in the region of the connection structures 252 of the leadframe 250. This has the consequence that the leadframe sections 251 in each of the singulated sensors 100 no longer connect via material of the leadframe 250. Each sensor 100 formed comprises a section of the carrier plate 110, a section of the embedding layer 130, an emitter 121, a detector 122 and two optical elements 160 assigned to the emitter 121 and the detector 122. The rear-side contacts and front-side contacts of the semiconductor chips 121, 122 connect to front-side contact surfaces 117 of the associated leadframe sections 251, and may therefore be electrically contacted via the rear-side contact surfaces 118.

The other method sequences from among those explained above and also their possible modifications described above may likewise be carried out with the aid of the leadframe-based carrier plate 110, the production of which may be carried out in accordance with FIGS. 26 and 27. In this context, by way of example, an optics assemblage 180 may be arranged on the carrier plate 110 provided with the semiconductor chips 121, 122 and further constituents or on the surface constituted of the semiconductor chips 121, 122, the embedding layer 130, the insulating layers 150 and the contact layers 140, for example, using a radiation-nontransmissive adhesive 175 such as was explained with reference to FIGS. 17 and 18.

Further possible variants are those such as were explained with reference to FIGS. 10 to 16. In this sense, at least one barrier structure 170 may be provided on the carrier plate 110 carrying the semiconductor chips 121, 122 and further constituents, for example, by carrying out a molding process or separate producing and subsequent arranging, and an optics assemblage 180 may subsequently be positioned on the at least one barrier structure 170. Furthermore, an optics assemblage 180 equipped with at least one barrier structure 170 may be arranged on the carrier plate 110 carrying the semiconductor chips 121, 122 and further constituents.

The method sequences explained with reference to FIGS. 19 to 24 may also be carried out in a corresponding manner with the leadframe-based carrier plate 110 by front-side contacts of semiconductor chips 121, 122 being connected to front-side contact surfaces 117 of leadframe sections 251 via bond wires 190. Furthermore, in a corresponding manner, it is possible to fabricate sensors 100 comprising different numbers of semiconductor chips 121, 122, including sensors 100 comprising only one detector 122.

Besides the example depicted and described above, further examples are possible that may comprise further modifications and/or combinations of features. It is possible, for example, instead of the materials indicated above, to use other materials for sensors 100. Furthermore, the following modifications, not illustrated, may be considered.

One possible modification consists of, for example, providing radiation-transmissive optical elements not realized in the form of lenses comprising one or two curved surfaces. Optical elements comprising differently shaped optical surfaces comprising conical or pyramidal structure elements, for example, are also possible. Optical elements in the form of Fresnel lenses are a further example. Such optical elements may also be produced in a molding process or be realized as constituents of an optics assemblage.

As has been described above, the method sequences explained with reference to the figures may be carried out such that all radiation-transmissive optical elements are provided jointly on the carrier plate provided with the semiconductor chips. It is also possible for a plurality of subgroups (clusters) of radiation-transmissive optical elements to be provided. Here, each of a plurality of radiation-transmissive optical elements of individual subgroups may be provided jointly on the carrier plate provided with the semiconductor chips. Such a procedure is possible, for example, with regard to method sequences in which an optics assemblage is applied. Instead of the use of an optics assemblage comprising all optical elements of the sensors fabricated in an assemblage, a plurality of separate optics assemblages may be used and arranged on the carrier plate provided with the semiconductor chips.

In this example, each optics assemblage may comprise a respective subgroup of a plurality of radiation-transmissive optical elements connected to one another.

A further possible modification is, for example, sensors comprising at least one semiconductor chip of a different type besides one or a plurality of optoelectronic semiconductor chips. This may involve a driver chip, for example.

The detectors used may comprise additional circuit structures for evaluation. Such detectors may be realized, for example, in the form of ASIC chips (Application Specific Integrated Circuit).

Furthermore, semiconductor chips used to form sensors may comprise one or else a plurality of front-side contacts.

The latter variant may be considered, for example, with regard to detectors comprising a plurality of detection regions as a result of which the latter may be operated separately. Configurations in which semiconductor chips comprise only front-side contacts are also possible, for example. In a corresponding manner, semiconductor chips comprising a plurality of rear-side contacts may be used. Features and details described above may be applied in a corresponding manner for the plurality of contacts of a semiconductor chip. In a semiconductor chip comprising a plurality of front-side contacts, by way of example, each front-side contact may connect to a contact surface of a carrier plate via a contact layer and, if appropriate, additionally via an electrical connection element. The use of bond wires is also possible.

Although our sensors and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 118 996.0, the subject matter of which is incorporated herein by reference.

The invention claimed is:

1. A method of producing sensors comprising:
providing a carrier plate;
arranging semiconductor chips on the carrier plate, wherein the semiconductor chips comprise at least radiation-detecting semiconductor chips;
providing radiation-transmissive optical elements on the carrier plate provided with the semiconductor chips, wherein a plurality of radiation-transmissive optical elements are provided jointly on the carrier plate provided with the semiconductor chips; and
singulating the carrier plate provided with the semiconductor chips and the radiation-transmissive optical elements, thereby severing the carrier plate and forming separate sensors each comprising a severed section of the carrier plate, at least one radiation-detecting semiconductor chip and at least one radiation-transmissive optical element,
wherein arranging the semiconductor chips is carried out after providing the carrier plate,
providing the radiation-transmissive optical elements is carried out after arranging the semiconductor chips,
and singulating the carrier plate is carried out after providing the radiation-transmissive optical elements.

2. The method according to claim 1, wherein the semiconductor chips arranged on the carrier plate comprise radiation-emitting semiconductor chips, and the sensors formed by the singulating comprise at least one radiation-emitting semiconductor chip.

3. The method according to claim 1, wherein an embedding layer is formed on the carrier plate that laterally adjoins the semiconductor chips, and
cutouts are formed in the embedding layer via which contact surfaces of the carrier plate are at least partly uncovered, and contact layers are formed via which front-side contacts of semiconductor chips electrically connect to contact surfaces of the carrier plate.

4. The method according to claim 1, wherein an embedding layer is formed on the carrier plate that laterally adjoins the semiconductor chips, and
electrical connection elements are arranged on contact surfaces of the carrier plate, the embedding layer is formed in a manner laterally adjoining the electrical connection elements, and contact layers are formed via which front-side contacts of semiconductor chips electrically connect to electrical connection elements.

5. The method according to claim 1, wherein front-side contacts of semiconductor chips electrically connect to contact surfaces of the carrier plate via bond wires.

6. The method according to claim 1, comprising one of:
the carrier plate provided is a printed circuit board; or
the carrier plate provided comprises a leadframe.

7. The method according to claim 1, wherein providing the radiation-transmissive optical elements comprises molding and curing a molding compound on the carrier plate provided with the semiconductor chips.

8. The method according to claim 7, wherein the molding compound is a UV-curing molding compound, and an irradiation with UV radiation is carried out to cure the molding compound.

9. The method according to claim 1, wherein radiation-transmissive elements are arranged on semiconductor chips, front-side contacts of semiconductor chips electrically connect to contact surfaces of the carrier plate via bond wires, and an embedding layer encapsulating the semiconductor chips and bond wires and laterally adjoining the radiation-transmissive elements is formed on the carrier plate.

10. The method according to claim 9, wherein the radiation-transmissive elements and the embedding layer constitute a planar surface, and providing the radiation-transmissive optical elements is carried out after forming the embedding layer and on the planar surface constituted of the radiation-transmissive elements and the embedding layer.

11. The method according to claim 9, wherein the radiation-transmissive elements are formed from a glass material and comprise a laminar shape.

12. The method according to claim 1, wherein providing the radiation-transmissive optical elements comprises:
separately producing an optics assemblage comprising radiation-transmissive optical elements connected to one another; and
arranging the optics assemblage on the carrier plate provided with the semiconductor chips.

13. The method according to claim 12, wherein the optics assemblage comprises a radiation-nontransmissive barrier structure.

14. The method according to claim 12, wherein the optics assemblage is arranged on the carrier plate provided with the semiconductor chips using a radiation-nontransmissive adhesive.

15. The method according to claim 14, wherein at least one radiation-nontransmissive barrier structure is formed by curing the adhesive.

16. The method according to claim 12, wherein a radiation-nontransmissive barrier structure is provided on the carrier plate provided with the semiconductor chips, and the optics assemblage is arranged on the barrier structure.

17. The method according to claim 16, comprising one of:
providing the barrier structure comprises molding and curing a molding compound on the carrier plate provided with the semiconductor chips; or
the barrier structure is produced separately and arranged on the carrier plate provided with the semiconductor chips.

18. A method of producing sensors comprising:
providing a carrier plate;
arranging semiconductor chips on the carrier plate, wherein the semiconductor chips comprise at least radiation-detecting semiconductor chips;

providing radiation-transmissive optical elements on the carrier plate provided with the semiconductor chips, wherein a plurality of radiation-transmissive optical elements are provided jointly on the carrier plate provided with the semiconductor chips; and singulating the carrier plate provided with the semiconductor chips and the radiation-transmissive optical elements, thereby forming separate sensors comprising a section of the carrier plate, at least one radiation-detecting semiconductor chip and at least one radiation-transmissive optical element, wherein an embedding layer is formed on the carrier plate that laterally adjoins the semiconductor chips, and comprising one of:

electrical connection elements are arranged on contact surfaces of the carrier plate, the embedding layer is formed in a manner laterally adjoining the electrical connection elements, and contact layers are formed via which front-side contacts of semiconductor chips electrically connect to electrical connection elements; or cutouts are formed in the embedding layer via which contact surfaces of the carrier plate are at least partly uncovered, and contact layers are formed via which front-side contacts of semiconductor chips electrically connect to contact surfaces of the carrier plate.

19. A method of producing sensors comprising:

providing a carrier plate;

arranging semiconductor chips on the carrier plate, wherein the semiconductor chips comprise at least radiation-detecting semiconductor chips;

providing radiation-transmissive optical elements on the carrier plate provided with the semiconductor chips, wherein a plurality of radiation-transmissive optical elements are provided jointly on the carrier plate provided with the semiconductor chips; and singulating the carrier plate provided with the semiconductor chips and the radiation-transmissive optical elements, thereby forming separate sensors comprising a section of the carrier plate, at least one radiation-detecting semiconductor chip and at least one radiation-transmissive optical element, wherein front-side contacts of semiconductor chips electrically connect to contact surfaces of the carrier plate via bond wires.

20. The method according to claim 19, wherein radiation-transmissive elements are arranged on semiconductor chips, an embedding layer encapsulating the semiconductor chips and bond wires and laterally adjoining the radiation-transmissive elements is formed on the carrier plate, the radiation-transmissive elements and the embedding layer constitute a planar surface, and providing the radiation-transmissive optical elements is carried out after forming the embedding layer and on the planar surface constituted of the radiation-transmissive elements and the embedding layer.

\* \* \* \* \*